United States Patent [19]

Rotzoll

[11] Patent Number: 5,737,035
[45] Date of Patent: Apr. 7, 1998

[54] HIGHLY INTEGRATED TELEVISION TUNER ON A SINGLE MICROCIRCUIT

[75] Inventor: Robert Rudolf Rotzoll, Allen, Tex.

[73] Assignee: Microtune, Inc., Plano, Tex.

[21] Appl. No.: 426,080

[22] Filed: Apr. 21, 1995

[51] Int. Cl.[6] .................................................. H04N 5/44
[52] U.S. Cl. ........................... 348/725; 348/731; 455/315; 455/339
[58] Field of Search .................................... 455/302, 315, 455/339, 179.1; 348/725, 726, 731; H04N 5/44

[56] References Cited

U.S. PATENT DOCUMENTS

| | | |
|---|---|---|
| 3,839,676 | 10/1974 | Linnecar . |
| 4,176,351 | 11/1979 | DeVita . |
| 4,328,531 | 5/1982 | Nagashima . |
| 4,340,975 | 7/1982 | Onishi .................... 455/315 |
| 4,855,835 | 8/1989 | Tobita ..................... 348/731 |

FOREIGN PATENT DOCUMENTS 4321565  1/1995  Germany .................... H03B 5/12

OTHER PUBLICATIONS

Brochure from Philips, I²C bus specification, pp. 1–27.

*Primary Examiner*—Sherrie Hsia
*Attorney, Agent, or Firm*—Fulbright & Jaworski L.L.P.

[57] ABSTRACT

There is disclosed a fully integrated television receiver for receiving a standard antenna or cable input and outputting a standard video baseband signal and a standard audio baseband signal. The receiver employs an up-conversion mixer and a down-conversion image-rejection mixer in series to produce an on-chip IF signal. Audio detection of the IF signal is performed via an audio delay-locked loop operating in quadrature to the audio FM signal. Video detection of the IF signal is performed by frequency mixing the IF signal with the extracted video carrier of the IF signal. Variable load drive capability is provided for both the video output and the audio output.

128 Claims, 4 Drawing Sheets

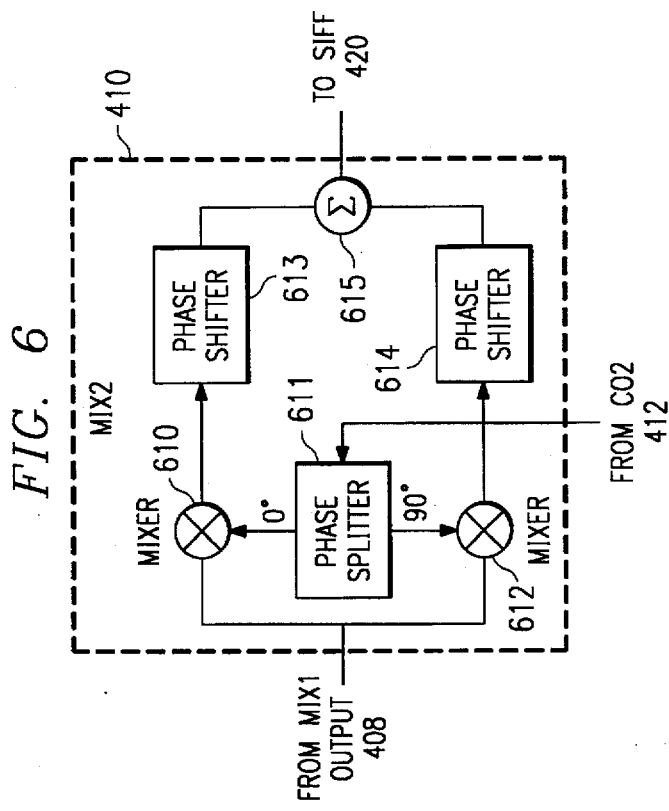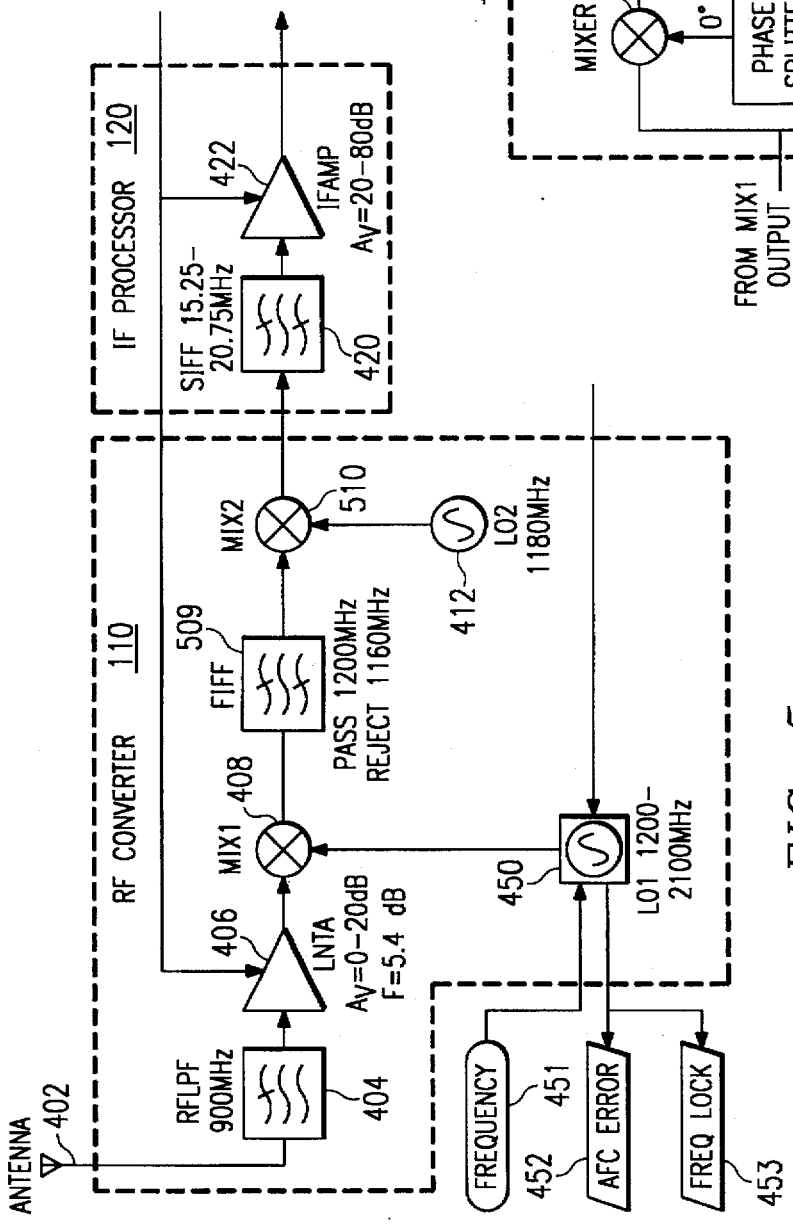

HIGHLY INTEGRATED TELEVISION TUNER ON A SINGLE MICROCIRCUIT

TECHNICAL FIELD OF THE INVENTION

This invention relates to television tuner circuits and more particularly to a highly integrated television tuner fabricated in a single microcircuit device.

BACKGROUND OF THE INVENTION

One of the most significant costs in television manufacturing is the cost of the tuner. The typical cost of a television (TV) tuner is in the neighborhood of $15.00, which, relative to the cost of the entire television set, is very substantial. Part of the solution to reducing tuner cost is to reduce the number of components in the tuner.

Traditionally, tuners have been comprised of two basic components. The first component performs high frequency to intermediate frequency (RF to IF) conversion. Subsequently, the second component performs IF to baseband conversion. The TV tuner was originally designed for broadcast television reception within a television set, which is essentially a stand-alone unit containing a cathode ray picture tube. So, TV tuners were originally integral parts embedded in a single-purpose device.

Presently, however, state-of-the-art consumer electronic devices use TV tuners that are not a built-in part of a television set. The tuner is a separate element that is connected to a cathode ray picture tube at some point, but the tuner is not an integral part of the monitor. For example, TV tuners may be fabricated on circuit boards and then installed in personal computer (PC) systems, thereby allowing the PC to function as a television set. These tuners convert a radio frequency television signal into a baseband (or low frequency) video signal which can then be passed on to other elements in the PC for video processing applications.

The circuit component that performs the RF-to-IF conversion typically comprises one or two integrated circuits and numerous discrete elements—inductors, capacitors and/or transistors. The IF-to-baseband conversion typically includes another integrated circuit, several filter elements, such as ceramic filters and SAW filters, a series of tuning and control elements, such as resistors and potentiometers, variable inductors and/or capacitors, and some other additional external components. Thus, the complexity of the tuner is fairly high and typically there may be between 100 and 200 elements on a circuit board. Furthermore, state-of-the-art TV tuners still require that each tuner be aligned by manual tuning before leaving the factory. This manual tuning is one of the most expensive costs associated with the manufacturing process and an important factor in the cost of tuners.

Broadcast television tuners of the past have gone through an evolution over a period of more than 60 years. The earliest tuners utilized vacuum tube technology and required that the minimum number of vacuum tubes possible be used due to their cost, power consumption and dimensions. Therefore, passive components, such as resistors, capacitors, inductors and transformers, were used as much as possible in most designs. This style of design continued until about 1960 when TV tuner components, particularly vacuum tubess began to be replaced by bipolar and MOS transistors. However; the active device count still defined the cost and size limits of TV tuners and active device count minimization continued.

In the early 1970's the integrated circuit became viable as an element in the television tuner and the design techniques were dramatically changed. Many functions of the tuner utilizing only one tube or transistor were being replaced with 4 to 20 individual transistors which could perform the same function with better precision, less spaced less powers less heat generation and lower costa The introduction of the integrated circuit was gradual, first encompassing only low frequency elements and then eventually high frequency active elements. Nonetheless, many passive elements external to the integrated circuits remained in TV tuner designs.

One advance, the SAW (surface acoustic wave) filters made a significant change in that several manually tuned inductors and capacitors could be removed from the tuners and receive-filtering performance could be improved within a much smaller space and at reduced cost. However, the SAW filter, which is fabricated on a ceramic substrate, cannot be integrated on a silicon wafer with the rest of the active circuitry and must therefore remain a discrete component in the final design. The trend of the 1980's was to miniaturize all of the passive components and simplify their associated manual tuning at the factory. In recent years. TV tuners have been reduced in size from requiring fairly large enclosures, about 2"×5"×1", to much smaller enclosures, about ½"×2"×⅜". There is a high premium placed on small size because TV tuners are being used in smaller and smaller computers, television sets and VCRs. As the equipment in which tuners are used becomes smaller, the size of the TV tuner must decrease also.

As the size of the tuner goes down, and as tuners are used in a wider variety of devices, cost becomes more critical and must be reduced as much as possible in order not to represent a large portion of the final product cost. When a tuner is used in a television set, the tuner size is less critical because the television set inherently has a large mass. But when a tuner is used in other electronic equipments space becomes a premium and the footprint of the tuner becomes critical.

Accordingly, it is one object of the invention to provide a TV tuner which has a relatively low cost and a small footprint for use on a printed circuit board.

It is another object of the present invention to provide a TV tuner that meets or exceeds the performance of state-of-the-art TV tuners while at the same time reducing the number of external components needed, thereby decreasing the complexity of the printed circuit board and the amount of circuit board area needed by the TV tuner.

It is the further object of the present invention no allow for computer control of the TV tuner by a serial bus so that the TV tuner may be controlled by a microcontroller imbedded in the television set, personal computer, or other video device.

It is the further object of the present invention to provide a TV tuner with computer-controlled output impedance characteristics to accommodate different load specifications.

SUMMARY OF THE INVENTION

These and other problems have been solved by integrating a TV tuner that takes a broad band of frequencies as an input and performs video demodulation over a very narrow band width. To accomplish this, an architecture was chosen to perform an up-conversion of the RF input signal to a higher internal frequency, which allows the present invention to have minimal filtering on the input stages of the receiver. The present invention is therefore able to operate without variable tuned filtering on its input, with the exception of a single fixed tuned filter. This eliminates the need for precisely controlled variable tuned filters which must be mechanically aligned during manufacture and are subject to variation in performance due to age, temperature, humidity, vibration and power supply performance. This was a critical drawback of previous tuners that had to be eliminated because it is a source of tremendous error and distortion, as well as complexity.

Furthermore, it is advantageous to have the up-conversion performed on-chip, because eliminating the inputting or outputting of high frequency signals to or from the integrated circuit of the present invention will avoid drive capability problems associated with high frequency signals and noise coupling problems associated with integrated circuit external interconnections.

The present invention next performs a down-conversion from the higher frequency using an image rejection mixing scheme that provides a tightly controlled down-conversion with very little added distortion. This also further minimizes the on-chip filtering effects by minimizing the amount of filtering that must be done at high frequency. The result is that high frequency operations within the present invention are limited to the initial stage inside the chip and are performed at a very low impedance level in order to minimize distortion. After the down conversions all remaining filtering is performed in continuous time mode filters that are realizable in an integrated circuit.

Another technical advantage of the present invention is that no manual-tuning of the final design is required. There are no external components needed to perform adjustments, as there is in the prior art.

A further technical advantage of the present invention is that the output impedance is selectable, based on system requirements, thereby minimizing power dissipation for certain applications. The present invention can drive a coaxial cable with a low output impedance driver or, for board level applications, the present invention can be configured to drive a high output impedance. The present invention can also match a very precise load impedance defined by a single external element.

The present invention advantageously utilizes much less board space than previous designs (on the order of 5% to 10% of the prior art designs) and dissipates only about one-fifth of the power. The present invention also advantageously operates on a single voltage level, as opposed to two or three levels for previous designs.

A further technical advantage of the present invention is that the need for a metal enclosure is reduced integration, by itself, allows for sufficient shielding to meet interference standards.

The monolithic television (MTV) tuner embodied in the present invention is intended to replace the TV tuner modules presently used in most broadcast television receiver devices. The MTV tuner integrates all of the functional elements of a tuner, except for the quartz crystal frequency reference and power supply bypass capacitors. The level of integration of the present invention dramatically reduces the cost of the basic TV tuner and enhances its manufacturability and reliability.

The TV tuner of the present invention is controlled externally by a computer or controller via a digital serial bus interface ($I^2C$). A preferred embodiment of the present invention provides an antenna input capable of being connected directly to a standard coaxial cable, thereby allowing both antenna and cable television applications. Furthermore, the baseband video and audio outputs are designed for high impedance or low impedance applications. The high impedance mode is a driver for short interconnections on a printed circuit and gives the benefit of low operating power. The low impedance mode drives an industry standard studio cable interface requiring greater supply power.

A preferred embodiment of the present invention is designed to operate on frequencies used for both over-the-air broadcasts and cable television with National Television Standards Committee (NTSC) encoded video. Receiver sensitivity is set to be limited by the antenna noise temperature for VHF systems. The present invention also employs a wide-range automatic gain control (AGC).

The baseband video output of the present invention is leveled, or has minimal variation in video amplitude with respect to antenna RF signal level, and can be configured via software for either low impedance studio standard loads or for high impedance loads with lower operating current. Audio output is broadband composite to allow connection to an external MTS decoder. The audio output can be configured for low impedance studio standard loads or high impedance loads via software control.

Control is accomplished via an $I^2C$ bus interface. The bias and control circuits in a preferred embodiment of the present invention contain internal registers which can be updated via the control bus for operating frequency, video and audio transmission standards such as NTSC, PAL, SECAM and MTS, power, and test modes. Status of the bias and control circuits can be checked via a status register accessible through the $I^2C$ bus interface. Status data include AFC error, channel lock and received signal strength indicator.

The operating frequency of the present invention is referenced to an external crystal or reference frequency generator. A minimum of external components are used with the present invention and no tuning of any components is required.

The present invention may be implemented in Bipolar, BiCMOS, or CMOS processes, however, a preferred embodiment of the present invention employs a BiCMOS process to reduce the difficulty in developing the design by allowing maximum flexibility.

A preferred embodiment of the present invention performs sound processing after IF amplification and prior to video demodulation. This method is known as "quasi-split" sound and is not used in the majority of television receivers for cost reasons. Quasi-split sound does not have a "buzz" in the audio signal during periods when the video picture is very white. In the integrated circuit of the present invention, quasi-split sound is a negligibly small cost and thus may be integrated in all embodiments of the present invention, integration of quasi-split sound further reduces component count and does not require external manual adjustments.

The foregoing has outlined rather broadly the features and technical advantages of the present invention in order that the detailed description of the integrated television tuner that follows may be better understood. Additional features and advantages of the monolithic television tuner will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 shows an alternate embodiment of the RF front-end of the present invention; and FIG. 6 is a detailed block diagram of MIX2 of FIG. 4.

DETAILED DESCRIPTION OF THE PRIOR ART

Before discussing the monolithic television tuner of the present invention, it will be useful to discuss a state-of-the-art television tuner found in the prior art.

While there have been theoretical proposals to integrate TV tuners in a single microcircuit, none are known to have been implemented. The next best definition of the known prior art, then, is a highly miniaturized, but not fully integrated, tuner as shown in FIG. 3.

Figure 3:
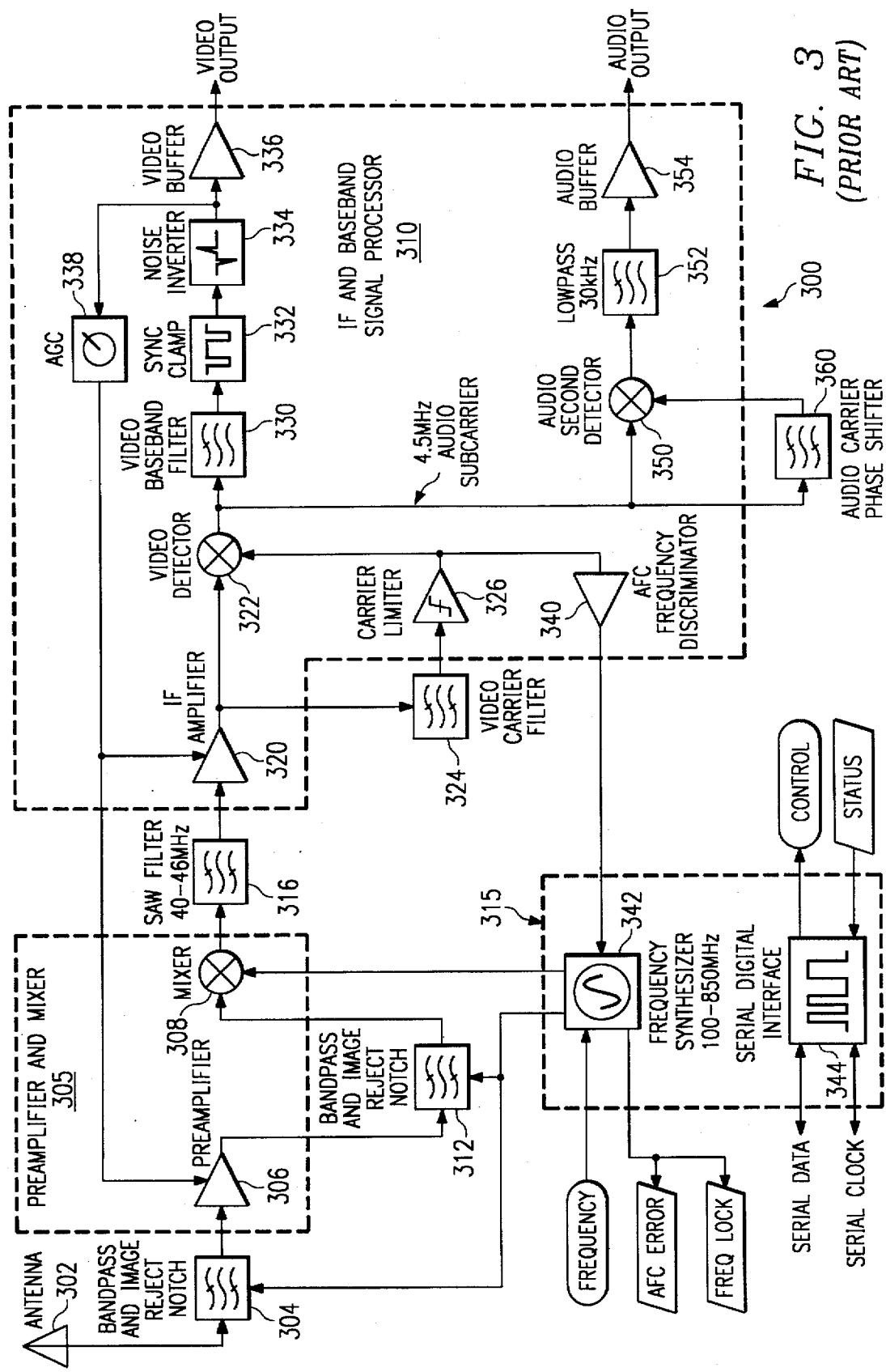
FIG. 3 is a detailed block diagram of a state-of-the-art television tuner found in the prior art.

FIG. 3 depicts a functional electrical block diagram of a present state-of-the-art TV tuner configuration. Television tuner 300 is constructed in a single metallically shielded assembly containing a printed circuit board on which all of the associated tuner components are mounted and electrically connected. TV tuner 300 is designed to be a module mounted on other printed circuit boards to allow for direct connection of the input and output signals to their appropriate terminations within the television receiving system. The metal shield is used to keep undesired external signals from interfering with the operation of the TV tuner 300 and to prevent TV tuner 300 from radiating signals that interfere with the operation of external devices.

Prior art television tuner 300 is comprised of three integrated circuits: preamplifier and mixer 305, IF and baseband signal processor 310 and frequency synthesizer and Inter integrated Circuit (IIC or I²C) bus interface 315. Television tuner 300 is also comprised of a plurality of discrete components, including bandpass and image reject notch filter 304, bandpass and image reject notch filter 312, surface acoustic wave (SAW) filter 316, video carrier filter 324, and audio carrier phase shifter 360.

Television tuner 300 receives a standard television RF signal from either antenna 302 or a cable system connection (not shown) through bandpass and image reject notch filter 304. Bandpass and image reject notch filter 304 limits the signals entering TV tuner 300 so that a minimum number of undesired signals exist in TV tuner 300. Filter 304 therefore limits the image response caused by the first mixer, described later. Filter 304 also attenuates signals not in a fairly narrow (100 MHz) range about the desired signal. Finally, known interference signals, such as FM broadcast, shortwave service signals, signals in the intermediate frequency band and Citizen Band radio signals, are specifically rejected by filter 304.

Preamplifier 306 of preamplifier and mixer 305 receives the output of bandpass and image reject notch filter 304 and raises the signal level (10 dB) with minimum increase in the noise level (typically 8–10 dB). The gain of preamplifier 306 is controlled by automatic gain control (AGC) 338, so that when a very strong signal enters TV tuner 300, overall gain is reduced, resulting in less distortion in the preamplifier than without the gain reduction.

The output of preamplifier 306 is sent to bandpass and image reject notch filter 312, with the same basic requirement of minimizing the passage of potential interference signals. Filter 312 is external to preamplifier and mixer 305 and is comprised of a plurality of discrete elements, including capacitors, inductors and varactor diodes.

The output of bandpass and image reject notch filter 312 is then sent back to mixer 308 in preamplifier and mixer 305. Mixer 308 mixes the output of filter 312 with the output of a local oscillator, frequency synthesizer 342, which has a frequency chosen to be higher than the desired receiver carrier by 45.75 MHz. Thus, the output of mixer 308 is 45.75 MHz. There also is an image signal due to mixer 308 at 91.5 MHz above the input frequency, which is removed by filter 304 and filter 312. Therefore, as the frequency of frequency synthesizer 342 is tuned to receive signals of different carrier frequencies, the bandpass and image reject filters 304 and 312 must also be tuned to properly pass only the desired signals and not the mixer images.

Frequency synthesizer 342 receives an input frequency reference signal (usually 16 bits) and outputs the status signals AUTOMATIC FREQUENCY CONTROL (AFC) ERROR and FREQUENCY (FREQ) LOCK. Additionally, a tuning signal which is used by the voltage controlled oscillator (VCO) in frequency synthesizer 342 is output from frequency synthesizer 342 to bandpass and image reject notch filters 304 and 312. A local oscillator signal is output from frequency synthesizer 342 to mixer 308.

The 45.75 MHz output signal of mixer 308 then passes through SAW (surface acoustic wave) filter 316, which limits the bandwidth of the signal to only one (1) channel (6 MHz for NTSC standard) and applies a linear attenuation in frequency known as the Nyquist slope around the visual carrier frequency. The linear attenuation by SAW filter 316 converts the signal from a vestigial sideband signal to one which is equivalent to a single sideband with a carriers, so that the frequency response of the signal after demodulation is flat over the video bandwidth. SAW filter 316 is very "lossy" (on the order of 25 dB), so the input to SAW filter 316 is amplified by a preamplifier (not shown) by a corresponding amount to minimize noise effects.

The output of SAW filter 316 is input to intermediate frequency (IF) amplifier 320 in IF and baseband signal processor 310. IF amplifier 320 provides most of the overall gain of TV tuner 300 and receives gain control from AGC 338.

The output of IF amplifier 320 is sent to video detector 322 and is also sent off-chip to external video carrier filter 324. This is the stage at which video demodulation is performed. Video detector 322 is essentially a mixer with the local oscillator input connected to the output of video carrier filter 324 through carrier amplitude limiter 326. The output of the carrier limiter 326 is an in-phase representation of the video carrier signal without any modulation applied to it. The output of carrier limiter 326 is received by video detector 322, which mixes the output of carrier limiter 326 with the output of IF amplifier 320.

AFC frequency discriminator 340 is used in the prior art device to detect the difference between the carrier frequency contained in the output of carrier limiter 326 and a known valid carrier frequency reference. The output signal on the output of AFC frequency discriminator 340 is an error signal which is used to drive frequency synthesizer 342 in a direction that will reduce the error between the output of carrier limiter 326 and the known valid carrier frequency reference.

The output of the video detector 322 is a baseband video signal combined with several high frequency mixing artifacts. These artifacts are removed by a video baseband filter 330. The output of video baseband filter 330 is fed to synchronization pulse clamp (sync clamp) 332, which sets the level of the sync pulses to a standard level.

Next, the output of sync clamp 332 is sent to noise inverter 334, which removes large noise spikes from the signal. The output of noise inverter 334 is sent to video buffer 336, which is configured to drive fairly high circuit board impedances of approximately 1000 to 2000 ohms.

The output of noise inverter 334 is also sent to AGC (automatic gain control) 338, which compares the level of the synchronization pulses to the signal blanking level to measure the incoming signal strength and generates a gain control signal which is used by IF amplifier 320 and RF preamplifier 306 to dynamically adjust the gain of the TV tuner 300 for the correct level at the final output.

The audio signal is an FM signal which follows the same path as the video through video detector 322. At the output of video detector 322, the audio signal appears as a subcarrier at 4.5 MHz, due to the fact that the audio signal comes into prior art TV tuner 300 4.5 MHz higher in frequency than the desired video carrier. The audio subcarrier is passed on to an FM quadrature demodulator. The FM quadrature demodulator is comprised of a mixer, audio second detector 350, and a 90 degree (at 4.5 MHz) phase shifter, audio carrier phase shifter 360. The output of the audio second detector 350 is a baseband audio signal, which is filtered by lowpass (30 kHz) filter 352 to remove any undesired high frequency components. The output of lowpass filter 352 is finally passed on to audio buffer 354, which drives an audio amplifier that ultimately drives a speaker. Serial digital interface 344 receives SERIAL DATA and SERIAL CLOCK inputs to provide control and update status for the prior art television receiver.

Baseband and image reject notch filters 304 and 312 are typically comprised of a plurality of capacitors, inductors and varactor diodes. Video carrier filter 324 is usually comprised of three discrete elements: an inductor and two capacitors. Likewise, audio carrier phase shifter 360 is also comprised of an inductor and two capacitors. In addition to the circuit elements shown as discrete components outside of circuit elements 305, 310 and 315 in FIG. 3, other discrete components (not shown) are connected to IF and baseband signal processor 310 and frequency synthesizer 342 for tuning purposes. Frequency synthesizer 342 is typically tuned by several external capacitors, inductors and/or varactor diodes. Video buffer 336 and audio buffer 354 will also typically employ external discrete elements, such as resistors, capacitors and/or transistors. Video baseband filter 330 and low pass filter 352 may also employ external inductors and capacitors.

DETAILED DESCRIPTION OF THE INVENTION

Figure 1:
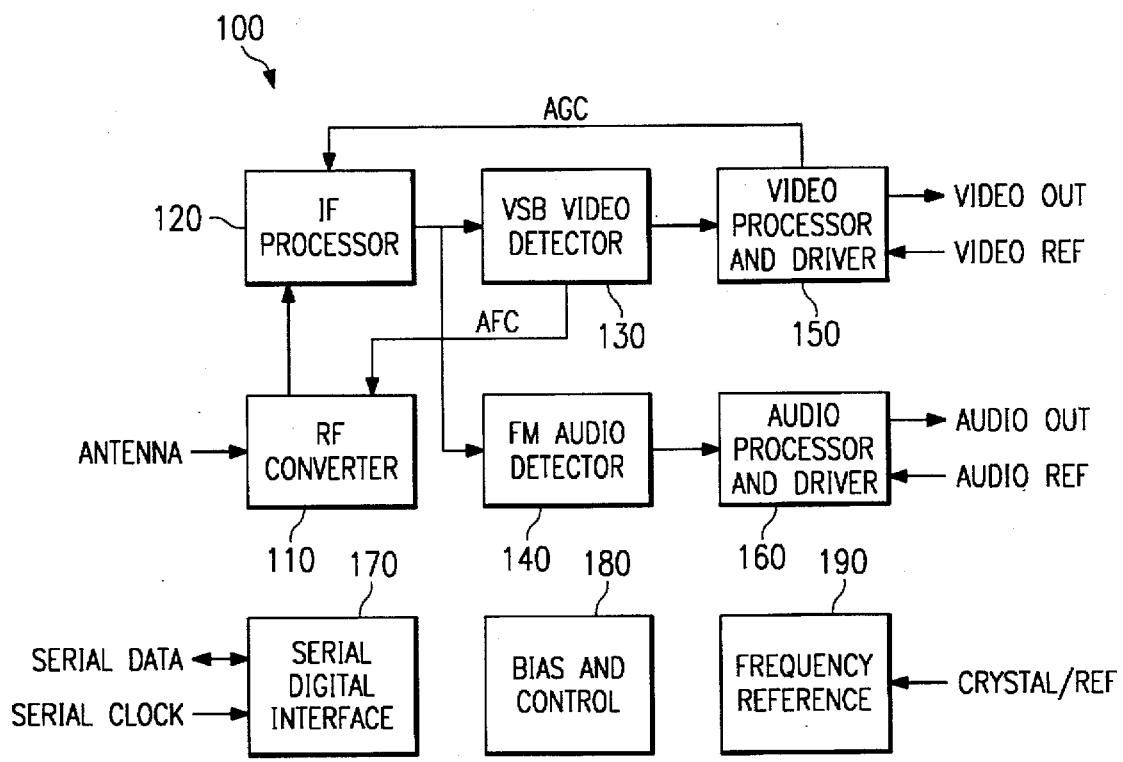
FIG. 1 is a high level block diagram of the functional components of the present invention.

FIG. 1 depicts a high-level block diagram of the functional elements contained in a preferred embodiment of TV tuner 100. The RF signal received from the antenna or other source is converted by RF converter 110 to an intermediate frequency (IF) signal and sent to IF processor 120. The output of IF processor 120 is sent to Vestigial Sideband (VSB) detector 130 and video processor and driver 150 to produce the video output signal of the present invention. The video signal is detected via a synchronous AM demodulator.

The output of IF processor 120 is also sent to FM detector 140 and audio processor and driver 160 in order to produce the audio output signal of the present invention. Audio detection is performed by a quadrature FM detector utilizing a phase-locked loop for the quadrature reference. I²C interface 170 receives I²C DATA and I²C CLOCK signals from the I²C interface bus. Frequency reference 190 is an oscillator that is synchronized to the external reference crystal. Bias and control logic circuit 180 defines internal bias voltages and currents and maintains the status and control registers of the television tuner of the present invention.

Figure 2:
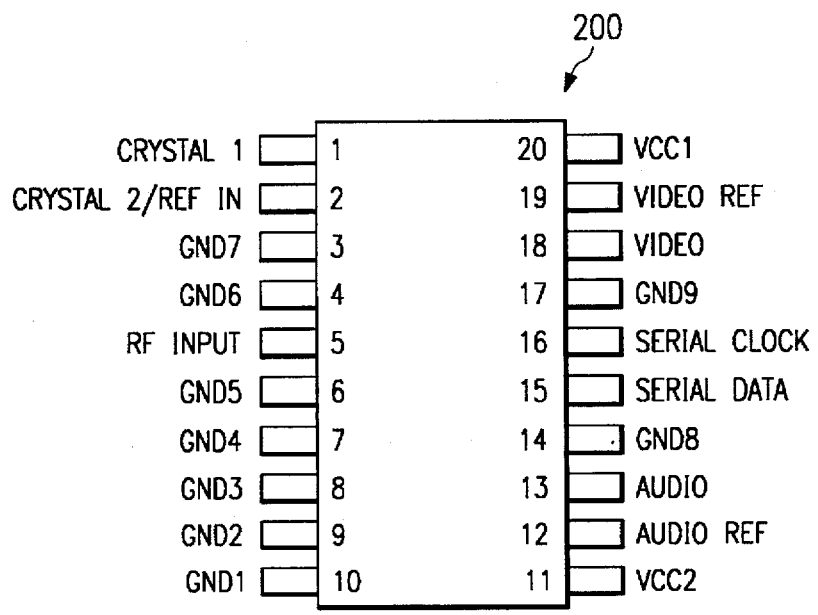
FIG. 2 is a pin layout diagram of an integrated circuit in accordance with the present invention.

FIG. 2 illustrates a pin layout diagram of a preferred embodiment of an integrated circuit in accordance with the present invention. Integrated circuit 200 is connected to a supply voltage on pins 11 and 20 (VCC1 and VCC2) and is grounded on pins 3, 4, 6–10, 14 and 17 (GND1–GND9). An input reference signal from an external crystal oscillator is supplied on pins 1 and 2 (CRYSTAL 1 and CRYSTAL 2/REF IN). Integrated circuit 200 is connected to an IIC (I²C) interface bus on pin 16 (SERIAL CLOCK) and pin 15 (SERIAL DATA). The RF input from an antenna or other source is connected to pin 5 (RF INPUT). Integrated circuit 200 outputs video and audio signals on pins 18 and 19 (VIDEO and VIDEO REF) and pins 12 and 13 (AUDIO and AUDIO REF).

Figure 4:
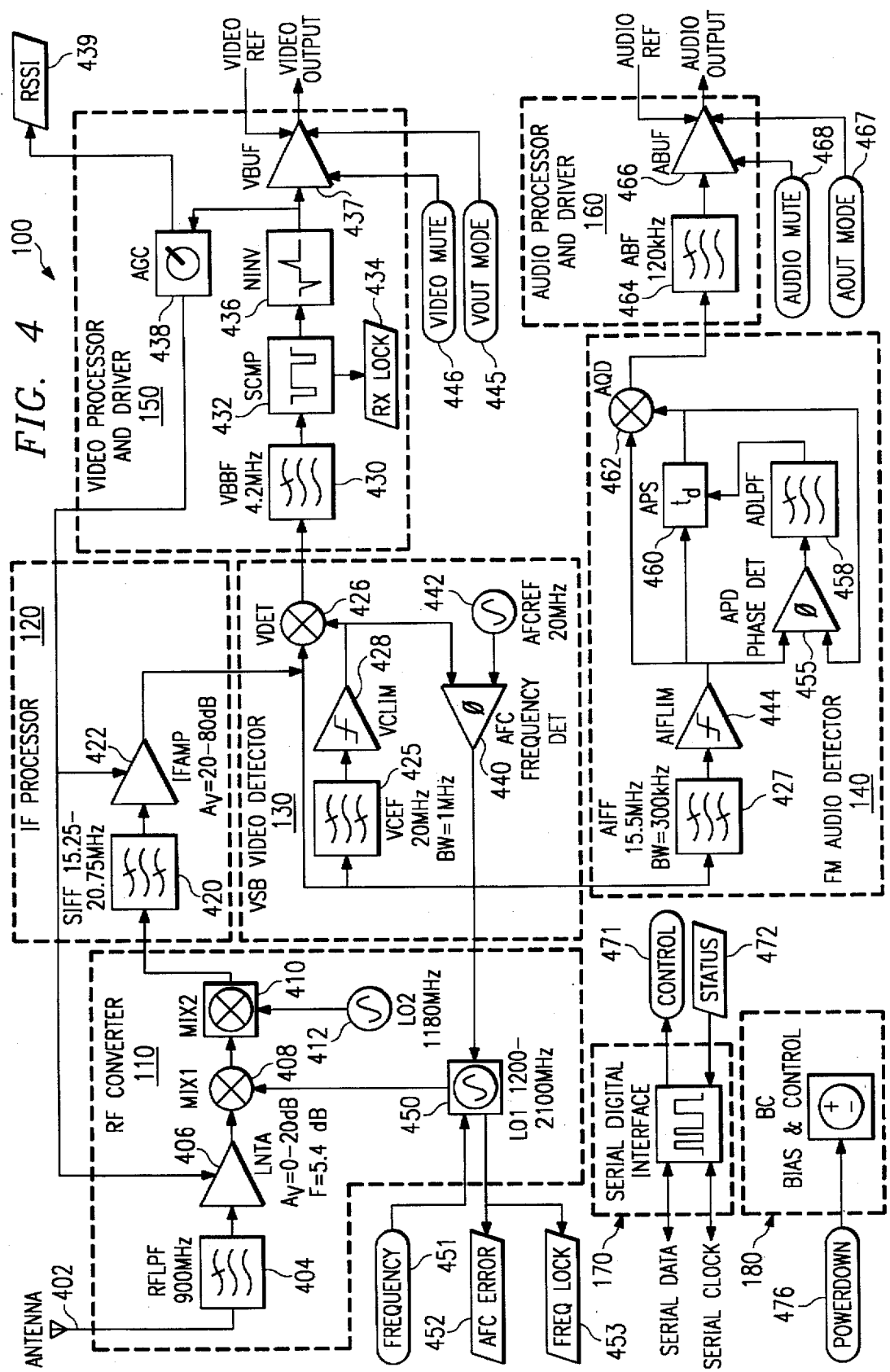
FIG. 4 is a detailed block diagram of the circuit components of the present invention.

FIG. 4 is a detailed electrical block diagram of TV tuner 100 in accordance with a preferred embodiment of the present invention. FIG. 4 depicts an up-converting dual conversion superheterodyne receiver. The Vestigial Sideband (VSB) encoded video signal is processed via a Nyquist slope receiver attenuation characteristic filter prior to detection.

The RF signal enters TV tuner 100 from the antenna 402 (or cable, not shown) and is passed through RF low-pass filter (RFLPF) 404 to limit the incoming band to below 900 MHz. The filtered RF signal is amplified up to 20 dB by a gain-controlled low-noise transconductance amplifier (LNTA) 406.

The input signal received by antenna 402, filtered by RFLPF 404 and amplified by LNTA 406 is the standard broadcast television spectrum. Channels 2–13 in the VHF band extend from 54 Megahertz to 216 MHz and channels 14–83 in the UHF band extend from 410 MHz to 890 MHz. Each channel in the VHF and UHF band has a 6 MHZ bandwidth with the video carrier frequency located 1.25 MHz above the lower band edges a color carrier frequency located 3.58 MHz above the video carrier, and an audio carrier frequency located 4.5 MHz above the video carrier. For example, Channel 2 has a 6 MHz bandwidth from 54 to 60 MHz, a video carrier at 55.25 MHz, a color subcarrier at 58.83 MHz and an audio carrier at 59.75 MHz.

The output of first local oscillator (LO1) 450, operating between 1200 and 2100 MHz, is mixed in first mixer (MIX1) 408 with the RF signal to generate a first IF video carrier frequency of 1200 MHz. This approach leads to minimum distortion due to mixer images and harmonic mixing. The first IF is crudely filtered by the bandwidth limitation of first mixer 408 to minimize harmonic effects.

In a basic mixer scheme, a mixer receives two inputs, an RF input and a local oscillator (LO) input, and generates an IF output. The RF input has the general form:

$$V_{RF} = A \cos(\omega_{RF} t), \qquad [1]$$

the local oscillator input has the general form:

$$V_{LO} = B \cos(\omega_{LO} t), \qquad [2]$$

and the IF output is given by:

$$V_{IF} = V_{RF} \cdot V_{LO} \quad [3]$$

$$= AB/2[\cos(\omega_{RF} - \omega_{LO})t + \cos(\omega_{RF} + \omega_{LO})t].$$

In the frequency domain, the IF frequencies are given by: $f_{IF}=|f_{RF}\pm f_{LO}|$. In realizable mixers, there are various non-linearities which cause the generation of harmonics at multiples of the RF and IF frequencies. Thus, the IF spectrum contains harmonics at $f_{IF}=mf_{RF}\pm nf_{LO}$, where m and n are integers.

For example, if the output of local oscillator 450 is 400 MHz and the desired input signal to be demodulated from the antenna is 800 MHz, a basic mixer would perform an additive mix to obtain a 1200 MHz output at the output of mixer 408. However, since frequency synthesizer 450 also has a harmonic at 800 MHz, and a signal exists on the antenna at 400 MHz, these signals are also added to produce an 800 MHz output that would interfere with the desired signal to be demodulated at 800 MHz.

Mixer 408 is a subtractive mixer that will subtract the frequency of local oscillator 450 from the input RF spectrum between 0 Hz to 900 MHz that is filtered by RFLPF 404. For example, if the desired frequency to be demodulated in the RF input is 400 MHz, the local oscillator would be set to 1600 MHz and a basic mixer would generate two IF outputs:

$$f_{IF}=|400-1600|=1200 \text{ MHz and} \quad [4]$$

$$f_{IF}=|400+1600|=2000 \text{ MHz} \quad [5]$$

Since mixer 408 is a subtractive mixers the 2000 MHz signal will be filtered out and only the 1200 MHz signal will be passed on to mixer 410. Also, since mixer 408 is a subtractive mixer, the incoming spectrum is inverted on the output, so than the video carrier is 1.25 MHz below the upper edge of the 6 MHz channel bandwidth, the color carrier is 3.58 MHz below the video carrier and the aural carrier is 4.5 MHz below the video carrier. For example, the 6 MHz bandwidth of channel 2 from 54–60 MHz would appear inverted between 1201.25 MHz and 1195.25 MHz. The channel 2 video carrier would appear at 1200 MHz, the color carrier would appear at 1196.42 and the aural carrier would appear at 1195.5 MHz.

As noted above, it is ms a characteristic of both the input RF signal received, by mixer 408 from LNTA 406 and of frequency synthesizer 405 that harmonic signals exist at multiples of the desired frequencies. By using a subtractive mixer and a sufficiently high-frequency output from oscillator 450, the harmonics on the output of frequency synthesizer 450 will all be more than 1200 MHz higher in frequency than any of the input frequencies existing in the 0 Hz to 900 MHz range from antenna 402.

For example, the lowest output of local oscillator 450 is 1200 MHz. The first harmonic of this signal exists an 2400 MHz. Since the highest output signal passing through LNTA 406 is 900 MHz, the subtractive mix of the 2400 MHz harmonic and the 900 MHz signal from antenna 402 would yield a signal of |900–1200|=1300 MHz. This is higher than the desired 1200 MHz output from mixer 408, and may therefore be filtered out by low-pass filtering. Using a local oscillator whose output is higher that the RF input frequency is known as high-side injection.

The first IF signal of 1200 MHz is mixed in second mixer (MIX2) 410, which is an image-rejection mixer, with the fixed 1180 MHz reference output of second local oscillator (LO2) 412 to generate the second IF at 20 MHz visual carrier. Because the RF input signal is lower in frequency than the LO referenced, the mixing of the two signals will result in a down conversion of the RF input. The IF frequencies, given by $f_{IF}=|f_{RF}\pm f_{LO}|$, have carriers at $f_{IF}=1200-1180=20$ MHZ and at $f_{IF}=1200+1180=2380$ MHZ. The image-rejection mixer specifically rejects signal energy in the first IF signal that is in the area of 1160 MHz, which would also yield an undesired signal at $f_{IF}=|1160-1180|=20$ MHz.

The image rejection mixer receives an input signal from MIX1 that has the general form:

$$V_{RF}=A \cos (\omega_{RF}t), \quad [6]$$

and the local oscillator signal from LO2 is split into two phase quadrature signals having the general form:

$$V_{LOI}=B \cos (\omega_{LO}t) \text{ and} \quad [7]$$

$$V_{LOQ}=B \sin (\omega_{LO}t). \quad [8]$$

The desired output signal, $V_{IF}$, resulting from the mixing of the RF input and the phase quadrature signals has the general form:

$$V_{IF}=AB \cos(\omega_{RF}-\omega_{LO})t. \quad [9]$$

The desired mixer signal at $\omega_{IF}=\omega_{RF}-\omega_{LO}$ appears in the mixer outputs while the undesired mixer image signal at $\omega_{IF}=\omega_{RF}+\omega_{LO}$ (−1160+1180=20) is rejected.

FIG. 5 depicts an alternate embodiment of the RF front-end (i.e., RF converter 110 and IF processor 120) of the present invention. First IF filter (FIFF) 509 between mixer 408 and mixer 510 filters out all frequency components of the image falling on 1160 MHz, such that mixer 510 is a basic mixer similar to mixer 408, rather than an image rejection mixer. While the image rejection mixer is easier to integrate, it has accuracy limitations, and noise and distortion figures may suffer.

Returning to FIG. 4, the second IF signal is next filtered for the final video bandwidth by second IF filter (SIFF) 420, a low-distortion continuous-time bandpass filter. SIFF 420 also comprises an automatically tuned low-pass Nyquist slope filter (NSF) for VSB balancing. The −6 dB point on the slope of the NSF is maintained at the visual carrier frequency (20 MHz).

The output of SIFF 420 is coupled to IF amplifier (IFAMP) 422, a gain-controlled amplifier which applies up to 80 dB of gain. The output of IFAMP 422 is then mixed in video detector (VDET) 426 with the video carrier, which has been extracted by video extraction filter (VCEF) 425 and video carrier limiter (VCLIM) 428 to produce the baseband video output.

The video carrier is compared by automatic frequency control (AFC, frequency detector (DET) 440 with a synthesized 20 MHz reference signal from AFCREF 442 to generate a frequency error signal which is passed back to LO1 for automatic frequency control.

The baseband video from VDET 426 is passed through a low-pass video bandwidth filter (VBBF) 430 to remove detection harmonics, The synchronization pulses are clamped to a reference level by sync clamp (SCMP) 432, which contains a phase-locked loop that is locked to the horizontal sync rate, RX LOCK 434, or vertical rate as an option, to control the clamp timing. Timing is also generated in SCMP 432 for AGC 438 and NINV 436. SCMP 432 amplifies the video to its output voltage level by a fixed gain of 20 dB. The clamped video is processed by noise inverter (NINV) 436 to remove excessively large positive or negative amplitude noise pulses.

The resulting video is tested for blanking to sync level by AGC 438, which adjusts the gain of LNTA 406 and IFAMP 422 to maintain a standard 1 Volt peak-to-peak video signal. The video at this stage is buffered by video buffer (VBUF) 437 for off-chip drive using one of three signal impedance standards. VBUF 437 can also mute the signal.

Audio processing is accomplished by extracting the audio signal at the output of IFAMP 422 through narrow bandpass audio IF filter (AIFF) 427. AIFF 427 produces an FM signal that is limited by audio IF limiter (AIFLIM) 444 to remove AM noise and distortion.

A delay-locked loop comprised of audio phase detector (APD) 455, audio delay-locked loop low-pass filter (ADLPF) 458, and audio phase shifter (APS) 460 generates a signal that is delayed by 90° at the FM carrier frequency and mixes that signal with the limited FM signal in audio quadrature detector (AQD) 462 for quadrature detection of the FM. The audio baseband is passed through a 120 kHz low-pass audio baseband filter (ABF) 464 to remove detection artifacts. The audio is buffered in audio buffer (ABUF) 466 for off-chip drive with selectable drive impedances at a 0.35 Volt (rms) level.

Control registers 471 and status registers 472 are interfaced to serial digital interface 170. Serial digital interface 170 in turn receives external commands from an external microprocessor or microcontroller through SERIAL DATA and SERIAL CLOCK control lines. In a preferred embodiment of the present invention, serial digital interface 170 may be a Inter integrated Circuit (IIC or $I^2C$) interface, which is a proprietary specification of Philips Corporation.

System Block Specifications

The overall design of TV tuner 100 is guided by the limitations of what can be reliably designed on an integrated circuit. Blocks of TV tuner 100 are specified by referring to actual circuit elements so that capabilities such as noise, maximum signal handling, intermodulation and gain can be ascertained. Perhaps, the most important element of such a design is to limit expected chip performance so that it can be manufactured with a high yield and, therefore, a low cost. Note that all measurements in dBm are referenced to a standard video RF and baseband impedance of 75 Ω.

RF Low-Pass Filter (RFLPF)

Table 1 lists the operating parameters of RF low-pass filter (RFLPF) 404 in accordance with a preferred embodiment of the present invention. RFLPF 404 is a 900 MHz third order low-pass filter comprising package lead inductance, printed circuit capacitance and on-chip capacitors. For most applications RFLPF 404 should be satisfactory for image (2400–3300 MHz) rejection in MIX1. External filtering matched to 75 ohm impedance could be added for extreme situations, such as very large out-of-band signals.

TABLE 1

RFLPF Specifications

| Parameter | Description | Min | Typ | Max | Unit |
|---|---|---|---|---|---|
| $G_V$ | Voltage Gain | −1 | | 0 | dB |
| $f_c$ | Cutoff Frequency (−3 dB) | | 900 | | MHz |

Low Noise Transconductance Amplifier (LNTA)

Table 2 lists the operating parameters of low-noise transconductance amplifier (LNTA) 406 in accordance with a preferred embodiment of the present invention. LNTA 406 is the front end of the receiver. The single-ended input signal is converted to a differential current which will be passed through a mixer chain. The critical function of this circuit is to maintain a very low noise figure (NF), a substantial gain ($G_V$), and a high third-order intermodulation intercept ($IP_3$). The gain is determined relative to the rest of the circuit so that the noise figure of this block dominates the total receiver noise figure. Note that, since this is a transconductance amplifier, the gain is defined by the load impedance of the final mixer stage and must be properly defined before a final determination of LNTA 406 performance. AGC capability is included to reduce the impact of distortion, such as intermodulation or crossmodulation, in the presence of high level signals. The input is impedance matched to 75 Ω.

TABLE 2

LNTA Specifications

| Parameter | Description | Min | Typ | Max | Unit |
|---|---|---|---|---|---|
| $G_V$ | Voltage Gain - no AGC | 20 | | 30 | dB |
| $G_{VAGC}$ | Voltage Gain - full AGC | −10 | | 0 | dB |
| NF | Noise Figure | 4.5 | | 5.4 | dB |
| $P_{-1dB}$ | 1 dB Gain Compression Input Level | −24 | | | dBm |
| $IP_3$ | Third Order Input Intercept | −10 | | | dBm |
| $f_{in}$ | Input Frequency | 40 | | 900 | MHz |
| $I_{DC}$ | DC Bias Current | | 20 | | mA |

First Mixer (MIX1)

Table 3 lists the operating parameters of first mixer (MIX1) 408 in accordance with a preferred embodiment of the present invention. Proper rejection of any undesired images and spurious signals due to local oscillator harmonics requires that MIX1 be configured for an up-conversion scheme with high-side injection. Thus, the output of MIX1 for the visual carrier is at the microwave frequency of 1200 MHz, the audio carrier is at 1195.5 MHz, and local oscillator 450 input runs between 1.2 and 2.1 GHz. A single-pole low-pass element is designed into the output circuitry of MIX1 to assist in the rejection of any down-converted signals due to local oscillator harmonics. The noise and distortion effects of MIX1 are included in LNTA 406 specifications. The design will include a bond-wire parallel LC network option to further band-limit any image energy at the output of this mixer if necessary.

TABLE 3

MIX1 Specifications

| Parameter | Description | Min | Typ | Max | Unit |
|---|---|---|---|---|---|
| $f_{RF}$ | RF Input Frequency | 40 | | 900 | MHz |
| $f_{LO}$ | LO1 Input Frequency | 1200 | | 2100 | MHz |
| $f_{IF}$ | IF Output Frequency | 1195 | | 1205 | MHz |
| $V_{LO}$ | LO1 Input Voltage | | 0.2 | | V(rms) |

Second Mixer (MIX2)

Table 4 lists the operating parameters of second mixer (MIX2) 410 in accordance with a preferred embodiment of the present invention. The first IF of 1.2 GHz (visual carrier) is input to MIX2, which is an image-rejection mixer, which down-converts to a 20 MHz second IF. The image reaction is done to negate the need for filtering of the first mixer output in order to reject signals falling on the image at 1160 MHz from being down-converted by MIX2 if MIX2 were just an ordinary subtractive mixer. An important feature of MIX2 is that it must achieve a high image rejection (at least 50 dB) without the need for post-fabrication trimming techniques to calibrate MIX2. As shown in FIG. 6, the 50 dB image rejection may be achieved by paralleling two Gilbert cell multipliers 610 and 612 at MIX2 input and using fairly high-order balanced RC-phase shifters 613, 614 with very low component sensitivity with resulting phase errors via summer 615 of less than 0.2 degrees over a 20 MHz bandwidth. Multipliers 610 and 612 receive inputs from Phase Splitter 611 and MIX1 408. These are traditionally avoided due to relatively high noise levels, however, in a preferred embodiment of TV tuner 100, the preious stages provide sufficient gain reduce the noise impact.

TABLE 4

MIX2 Specifications

| Parameter | Description | Min | Typ | Max | Unit |
|---|---|---|---|---|---|
| $G_I$ | Current Gain | | | 0 | dB |
| NF | Noise Figure | | | 10 | dB |
| $f_{RF}$ | RF Input Frequency | 1195 | | 1205 | MHz |
| $f_{LO}$ | LO2 Input Frequency | | 1180 | | MHz |
| $f_{IF}$ | IF Output Frequency | 15.25 | | 21.25 | MHz |
| $V_{LO}$ | LO2 Input Valtage | | 0.2 | | V(rms) |
| $A_{IM}$ | Input Image Rejection | 60 | | | dB |

Second IF Filter (SIFF)

Table 5 lists the operating parameters of second IF filter (SIFF) 420 in accordance with a preferred embodiment of the present invention. The 20 MHz IF signal is filtered for channel bandwidth in this integrated transconductor-capacitor ($G_m$-C) filter. A transitional Gaussian bandpass filter is used to provide adjacent channel and noise rejection. SIFF 420 keeps the distortions due to noise and out-of-band signals below −54 dBc. The in-channel group delay is to be maximally flat to the color subcarrier frequency. The aural signal passes through SIFF 420. Since the up-conversion scheme inverts the channel frequencies at the output of MIX2, the visual carrier is now at 20 MHz and the aural carrier is at 15.5 MHz. The adjacent visual carrier is now at 14 MHz and the adjacent aural carrier is at 21.5 MHz leading to the filter specifications given below.

TABLE 5

SIFF Specifications

| Parameter | Description | Min | Typ | Max | Unit |
|---|---|---|---|---|---|
| $f_{p1}$ | Lower Passband Limit $A(\omega) < 0.5$ dB | | 16.75 | | MHz |
| $f_{ph}$ | Upper Passband Limit $A(\omega) < 0.5$ dB | | 19.25 | | MHz |
| $f_{sl}$ | Lower Stopband Limit $A(\omega) > 54$ dB | | 15.25 | | MHz |
| $f_{sh}$ | Upper Stopband Limit $A(\omega) > 54$ dB | | 20.75 | | MHz |
| $G_V$ | Voltage Gain | | 0 | | dB |
| $IP_3$ | Third Order Input Intercept | 20 | | | dBm |
| NF | Noise Figure | | | 15 | dB |

IF Amplifier (IFAMP)

Table 6 lists the operating parameters of IF amplifier (IFAMP) 422 in accordance with a preferred embodiment of the present invention. The 20 MHz signal is amplified by 80 dB in this block. The gain can be reduced 0 dB by application of an automatic gain control (AGC) signal voltage. The AGC is implemented in fully differential form for best on-chip noise rejection.

TABLE 6

IFAMP Specifications

| Parameter | Description | Min | Typ | Max | Unit |
|---|---|---|---|---|---|
| $G_V$ | Voltage Gain - No AGC | | 80 | | dB |
| $G_V$ | Voltage Gain - Full AGC | | 20 | | dB |
| NF | Noise Figure | | | 10 | dB |
| BW | Bandwidth | 25 | | | MHz |

Visual Carrier Extraction Filter (VCEF)

Table 7 lists the operating parameters of visual carrier extraction filter (VCEF) 425 in accordance with a preferred embodiment of the present invention. The video carrier at 15 MHz is extracted from IFAMP 422 output for synchronous detection processing. VCEF 425 passes along any incidental carrier phase modulation (ICPM) in the Nyquist filter without any group delay distortion for best detector performance.

TABLE 7

VCEF Specifications

| Parameter | Description | Min | Typ | Max | Unit |
|---|---|---|---|---|---|
| $G_V$ | Voltage Gain | | 0 | | dB |
| $f_0$ | Center Frequency | | 20 | | MHz |
| BW | Bandwidth | 0.5 | 1 | 3 | MHz |
| NF | Noise Figure | | | 5 | dB |

Visual Carrier Limiter (VCLIM)

Table 8 lists the operating parameters of visual carrier limiter (VCLIM) 428 in accordance with a preferred embodiment of the present invention. The synchronous detector requires a fixed amplitude reference carrier. This is derived via VCEF 425 and then passed through VCLIM 428. With input level variations of 20 dB and depth of modulation possibly exceeding 95 percent, VCLIM 428 output is stable within an accuracy of −50 dB. The circuit delay of VCEF 425 and VCLIM 428 combined must not exceed 45 degrees at the visual carrier frequency so that the detector output level and noise behavior is not degraded.

TABLE 8

VCLIM Specifications

| Parameter | Description | Min | Typ | Max | Unit |
|---|---|---|---|---|---|
| $G_V$ | Voltage Gain | 46 | | | dB |
| $V_{th}$ | Limiter Input Threshold | | 10 | | mV(p—p) |
| $V_{limit}$ | Limiter Output Level | 2 | | | V(p—p) |
| NF | Noise Figure | | | 5 | dB |

Video Detector (VDET)

Table 9 lists the operating parameters of video detector (VDET) 426 in accordance with a preferred embodiment of the present invention. Video is detected synchronously by applying the output of IFAMP 422 as a first input signal and the output of VCLIM 428 as a second input signal to a double-balanced mixer (VDET 426). The output of VDET 426 is configured with a single low-pass pole set to allow 4.2 MHz to pass with a 0.5 dB loss.

TABLE 9

VDET Specifications

| Parameter | Description | Min | Typ | Max | Unit |
|---|---|---|---|---|---|
| $G_V$ | Voltage Gain | | 0 | | dB |
| BW | Output −0.5 dB Bandwidth | | 4.2 | | MHz |
| $V_{video}$ | Video Output Level | | 0.1 | | V(p—p) |
| NF | Noise Figure | | | 5 | dB |

Video Baseband Filter (VBBF)

Table 10 lists the operating parameters of video baseband filter (VBBF) 430 in accordance with a preferred embodiment of the present invention. The detected video is band-limited to 4.2 MHz by a multiple pole transitional Gaussian response low-pass filter which has been predistorted for both compensation of SIFF 420 response and group delay characteristics conforming to FCC regulations. VBBF 430 rejects the video carrier at 20 MHz and the high level 40 MHz modulated signal at the output of VDET 426 with minimum pass-band transient distortion.

TABLE 10

VBBF Specifications

| Parameter | Description | Min | Typ | Max | Unit |
|---|---|---|---|---|---|
| $G_V$ | Voltage Gain | | 0 | | dB |
| $f_p$ | Passband Corner Frequency A(ω) < 0.5 dB | | 4.2 | | MHz |
| $f_s$ | Stopband Corner Frequency A(ω) > 54 dB | | 8.0 | | MHz |
| NF | Noise Figure | | | 5 | dB |

Sync Clamp (SCMP)

Table 11 lists the operating parameters of sync clamp (SCMP) 432 in accordance with a preferred embodiment of the present invention. The sync pulses are clamped via two techniques. A diode clamp is used to define the minimum level to which the sync tip is set. Once this is achieved, after one sync pulse, a sync slicer regenerates the sync pulses only and passes these on to a phase-locked loop (PLL). The PLL acquires the horizontal sync rate and generates a sync gating pulse approximately centered in the horizontal sync pulse.

Once the PLL has achieved lock, a gated clamp circuit using the sync gating pulse is enabled to define the sync level and the diode clamp is disabled. For processing of scrambled video, a line counter is inserted into the phase-locked loop to count a field, the sync is integrated for detection of vertical sync and only the vertical sync pulse is used for the clamp gate. The sync gating pulse is used, via a clocked delay of 5 microseconds to generate a blanking gate used for AGC processing. SCMP 432 also amplifies the video to its final output level. The output signal RX LOCK 434 becomes active when the phase-locked loop has achieved lock to the sync pulses.

TABLE 11

SCMP Specifications

| Parameter | Description | Min | Typ | Max | Unit |
|---|---|---|---|---|---|
| $G_V$ | Voltage Gain | | 20 | | dB |
| $V_{video}$ | Video Output Level | | 1 | | V(p—p) |
| $f_{PLLH}$ | PLL Operating Frequency H-Sync Mode | | 15750 | | kHz |
| $f_{PLLV}$ | PLL Operating Frequency V-Sync Mode | | 60 | | Hz |

Noise Inverter (NINV)

Table 12 lists the operating parameters of noise inverter (NINV) 436 in accordance with a preferred embodiment of the present invention. SCMP 432 video output will include extreme transient noise pulses in both black and white directions. The black noise is typically a large RF transient due to some form of interference. The signal will drop below the blanking level during the horizontal line picture period and may upset downstream sync detect circuits. A comparator detects these levels below the blanking level during active picture, or non-blanked, periods and enables an inverting video path during the event which is summed with the original video. The summation cancels the effect of the noise pulse so that the sync level region is not disturbed. Extreme positive excursions, which appear as white, are also cancelled when they exceed the equivalent 108 IRE white level, or less than 5 percent modulation. These typically are due to desensitization effects of the receiver when pulse interference exists on an out of band frequency and typically result in the disruption of the synchronous detector. Positive noise inversion is accomplished using a comparator referenced to the 108 IRE level and enabling a video inversion path to a summer as for the negative case above.

TABLE 12

NINV Specifications

| Parameter | Description | Min | Typ | Max | Unit |
|---|---|---|---|---|---|
| $V_{video}$ | Video Input Level | | 1 | | V(p—p) |
| $V_{WINS}$ | White Noise Inverter Insertion Level | | 95 | | IRE |
| $V_{BINS}$ | Black Noise Inverter Insertion Level | | 10 | | IRE |
| $V_{WTH}$ | White Inverter Threshold | | 108 | | IRE |
| $V_{BTH}$ | Black Inverter Threshold Non-Blanked | | 0 | | IRE |

Automatic Gain Control (AGC)

Table 13 lists the operating parameters of automatic gain control (AGC) 438 in accordance with a preferred embodiment of the present invention. The clamped video is fed into a sample-and-hold circuit controlled by the blanking gate. The sample-and-hold circuit output drives a differential amplifier which has a reference level at its other input equal to the desired output blanking level for the standard NTSC video waveform.

On each horizontal sync pulse the output of the differential amplifier represents the gain error of the receiver to achieve the video waveform. This is fed back to LNTA 406 and IFAMP 422 to adjust the gain as necessary. The timing and gain of the differential amplifier must be set for fast transient response time to account for aircraft induced flutter (fading) and unconditional stability. The response can be changed to update gain only during the vertical sync period, just as with SCMP 432, so that scrambled video may pass through the tuner without any adverse effects.

The AGC voltages defined by the performance of the RF and IF amplification behavior and input signal level, is measured via 4 bit analog-to-digital converter and stored as the data word Received Signal Strength Indicator (RSSI) 439. Automatic gain control is applied first to IFAMP 422 to reduce the video level, and beyond 50 dB of reduction, also to LNTA 406, which implements a delayed AGC function.

TABLE 13

| | AGC Specifications | | | | |
|---|---|---|---|---|---|
| Parameter | Description | Min | Typ | Max | Unit |
| $V_{Video}$ | Video Input Level | | 1 | | V(p—p) |
| $V_{s-b}$ | Input Sync to Blanking Level Reference | | 0.286 | | V |
| $G_{AGC}$ | AGC Loop Gain | 70 | | | dB |
| $GBW_H$ | AGC Gain-Bandwidth H-Mode | | 150 | | Hz |
| $GBW_v$ | AGC Gain-Bandwidth V-Mode | | 6 | | Hz |
| $\phi_{MAGC}$ | AGC Loop Phase Margin | 60 | | | ° |

Video Output Buffer (VBUF)

Table 14 lists the operating parameters of video buffer (VBUF) 437 in accordance with a preferred embodiment of the present invention. The video is at an internal level of 1 volt peak-to-peak differential. VBUF 437 converts this signal to a current via a linear transconductance amplifier that drives a load resistor. Feedback is arranged via an external signal to allow for continuous adjustment of the gain and offset of the amplifier so that no AC coupling is required in the next stage. An on-chip integrator is used to define the feedback level and reject the video signal. The control signal VOUT MODE 445 enables on-chip loads of 75 Ω, 1000 Ω or no load, which equates to a current source output. The control signal VIDEO MUTE 446 enables a video mute switch which sets the output to the blanking level.

TABLE 14

| | VBUF Specifications | | | | |
|---|---|---|---|---|---|
| Parameter | Description | Min | Typ | Max | Unit |
| $V_{Video}$ | Video Input Level | | 1 | | V(p—p) |
| $V_{OV}$ | Video Output Level ($R_L > 70 \Omega$) | | 1 | | V(p—p) |
| $V_{OVR}$ | Video Output DC Reference ($R_L > 70\Omega$) | 0.5 | | 3.5 | V |
| $Z_{OUT}$ | Output Impedance 75Ω Mode | 73 | 75 | 77 | Ω |
| $Z_{OUT}$ | Output Impedance 1000Ω Mode | 980 | 1000 | 1020 | Ω |
| $Z_{OUT}$ | Output Impedance Current Mode | | 10 | | kΩ |

Automatic Frequency Control (AFC) Frequency Detector

Table 15 lists the operating parameters of automatic frequency control (AFC) frequency detector (DET) 440 in accordance with a preferred embodiment of the present invention. The extracted IF video carrier is compared to a fixed reference at 20 MHz and used to drive LO1 in a direction to equalize the two. The error in LO1 from its frequency control setting is the signal AFC ERROR 452. The 20 MHz reference is generated via a frequency synthesizer from the master reference. The 20 MHz reference is compared to the extracted video carrier signal at the output of VCEF 425 using a digital frequency comparator which drives a seven bit up-down counter that is summed with the low bits of the frequency code sent to LO1 from the I²C interface 170. Thus, the frequency error appears in the counter which can be read via the interface bus. This counter is set to 1000000b when there is no frequency error. This condition sets the status signal FREQ LOCK 453.

TABLE 15

| | AFC Specifications | | | | |
|---|---|---|---|---|---|
| Parameter | Description | Min | Typ | Max | Unit |
| $V_{CIN}$ | Video Carrier Input Level | | 0.1 | | V(p—p) |
| $f_{ERROR}$ | Frequency Error From Nominal | −500 | | 500 | kHz |
| $f_{UPDATE}$ | Frequency Update Rate | | | 30 | Hz |

AFC Reference Oscillator (AFCREF)

Table 16 lists the operating parameters of AFC reference oscillator (AFCREF) 442 in accordance with a preferred embodiment of the present invention. AFCREF 442 is a fixed frequency synthesizer running at 20 MHz, which is phase-locked to the quartz crystal frequency reference. Phase noise is not particularly critical due to the application of this circuit at low modulation frequencies only.

TABLE 16

| | AFCREF Specifications | | | | |
|---|---|---|---|---|---|
| Parameter | Description | Min | Typ | Max | Unit |
| $V_C$ | Carrier Level | | 0.2 | | V(p—p) |
| $N_{op}$ | Phase Noise for 20 Hz < $f_m$ < 1 MHz | | | −60 | dBc |
| $f_0$ | Operating Frequency | | 20 | | MHz |

First Local Oscillator (LO1)

Table 17 lists the operating parameters of first local oscillator (LO1) 450 in accordance with a preferred embodiment of the present invention. LO1 is a phase-locked frequency synthesizer configured for specific levels of phase noise to allow for best receiver sensitivity without excessive spurious noise responses. It is digitally controlled and utilizes a quartz crystal reference for frequency and in-band phase noise control. The frequency control input FREQUENCY 451 from the serial digital interface 170 bus has sixteen (16) bits with 62.5 kHz LSB resolution. Four (4) more bits below the LSB as well as the first 3 LSB's are used by the AFC for fine tuning.

TABLE 17

| | LO1 Specifications | | | | |
|---|---|---|---|---|---|
| Parameter | Description | Min | Typ | Max | Unit |
| $V_C$ | Carrier Level | | 0.2 | | V(p—p) |
| $N_{op}$ | Phase Noise for $f_m$ > 1 MHz | | | −110 | dBc |
| $N_{op}$ | Phase Noise for 60 Hz < $f_m$ < 1 MHz | | | −80 | dBc |

TABLE 17-continued

LO1 Specifications

| Parameter | Description | Min | Typ | Max | Unit |
|---|---|---|---|---|---|
| $f_0$ | Operating Frequency | 1200 | | 2100 | MHz |
| $f_{STEP}$ | Frequency Step | | 3.906 | | kHz |
| $f_{REF}$ | Reference Frequency | | 62.5 | | kHz |

Second Local Oscillator (LO2)

Table 18 lists the operating parameters of second local oscillator (LO2) 412 in accordance with a preferred embodiment of the present invention. LO2 is a fixed tuned frequency synthesizer set to 1180 MHz. It uses the same frequency reference as LO1 and has similar phase noise characteristics.

TABLE 18

LO2 Specifications

| Parameter | Description | Min | Typ | Max | Unit |
|---|---|---|---|---|---|
| $V_C$ | Carrier Level | | 0.2 | | V(p—p) |
| $N_{op}$ | Phase Noise for $f_m > 1$ MHz | | | −110 | dBc |
| $N_{op}$ | Phase Noise for 60 Hz $< f_m < 1$ MHz | | | −80 | dBc |
| $f_0$ | Operating Frequency | | 1180 | | MHz |
| $f_{REF}$ | Reference Frequency | | 62.5 | | kHz |

Audio IF Filter (AIFF)

Table 19 lists the operating parameters of audio IF filter (AIFF) 427 in accordance with a preferred embodiment of the present invention. The audio IF signal is tapped from the output of IFAMP 422 and run through a narrow-band filter operating a 15.5 MHz with a bandwidth of 300 kHz. AIFF 427 rejects the video carrier and the burst frequency components.

TABLE 19

AIFF Specifications

| Parameter | Description | Min | Typ | Max | Unit |
|---|---|---|---|---|---|
| $G_V$ | Voltage Gain | | 0 | | dB |
| $f_0$ | Center Frequency | | 15.5 | | MHz |
| BW | Bandwidth | | 300 | | kHz |
| NF | Noise Figure | | | 10 | dB |

Audio iF Limiter (AIFLIM)

Table 20 lists the operating parameters of audio IF limiter (AIFLIM) 444 in accordance with a preferred embodiment of the present invention. The audio IF is limited with a 40 dB possible variation in input level based on AGC 438 and the difference between sources of the broadcast signal. The output level accuracy over this range is better than −40 dB.

TABLE 20

AIFLIM Specifications

| Parameter | Description | Min | Typ | Max | Unit |
|---|---|---|---|---|---|
| $G_V$ | Voltage Gain | 40 | | | dB |
| $V_{th}$ | Limiter Input | | 2 | | mV (p-p) |

TABLE 20-continued

AIFLIM Specifications

| Parameter | Description | Min | Typ | Max | Unit |
|---|---|---|---|---|---|
| $V_{limit}$ | Threshold Limiter Output Level | | 0.2 | | V (p-p) |
| NF | Noise Figure | | | 10 | dB |

Audio Phase Detector (APD)

Table 21 lists the operating parameters of audio phase detector (APD) 455 in accordance with a preferred embodiment of the present invention. The audio IF is compared with APS 460 output no generate a phase error signal to drive APS 460 in a delay-locked loop. APD 455 is a phase detector configured for fast loop acquisition and minimum phase error once acquired.

TABLE 21

APD Specifications

| Parameter | Description | Min | Typ | Max | Unit |
|---|---|---|---|---|---|
| $V_{IN}$ | Voltage Input Level | | 0.35 | | V (rms) |

Audio DLL Low Pass Filter (ADLPF)

Table 22 lists the operating parameters of audio delay-locked loop low-pass filter (ADLPF) 458 in accordance with a preferred embodiment of the present invention. ADLPF 458 must not respond to any frequencies above 20 Hz in order to achieve the full audio bandwidth in the detected signal. The low-pass filter accommodates this requirement.

TABLE 22

APLPF Specifications

| Parameter | Description | Min | Typ | Max | Unit |
|---|---|---|---|---|---|
| $G_V$ | Voltage Gain | | 0 | | dB |
| BW | Loop Bandwidth | | | 20 | Hz |
| $Z_L$ | Closed Loop Zero | | 10 | | Hz |

Audio Phase Shifter (APS)

Table 23 lists the operating parameters of audio phase shifter (APS) 460 in accordance with a preferred embodiment of the present invention. APS 460 is a voltage controlled phase shifter which is locked to the audio carrier via a delay-locked loop. APS 460 generates a 90° degree phase shift in the output signal at the aural carrier frequency of 15.5 MHz.

TABLE 23

AQO Specifications

| Parameter | Description | Min | Typ | Max | Unit |
|---|---|---|---|---|---|
| $V_{OUT}$ | Output Voltage | | 0.1 | | V |
| $f_0$ | Center Frequency | | 15.5 | | MHz |
| $0_S$ | Phase Shift | | 90 | | Deg. |

Audio Quadrature Detector (AQD)

Table 24 lists the operating parameters of audio quadrature detector (AQD) 462 in accordance with a preferred embodiment of the present invention. AQD 462 is a mixer that is used to compare the incoming audio IF signal with a delayed version of the IF signal running in quadrature with the incoming carrier. The output is the desired audio baseband signal.

TABLE 24

AQD Specifications

| Parameter | Description | Min | Typ | Max | Unit |
|---|---|---|---|---|---|
| $G_v$ | Voltage Gain | | 0 | | dB |

Audio Baseband Filter (ABF)

Table 25 lists the operating parameters of audio baseband filter (ABF) 464 in accordance with a preferred embodiment of the present invention. ABF 464 is a high-order Chebychev low-pass design with a cutoff at 120 kHz. This is wide enough to pass all multiplex audio subcarriers for external decoding.

TABLE 25

ABF Specifications

| Parameter | Description | Min | Typ | Max | Unit |
|---|---|---|---|---|---|
| $G_V$ | Voltage Gain | | 10 | | dB |
| $f_p$ | Passband Corner Frequency A($\omega$) <0.5 dB | | 120 | | kHz |
| $f_s$ | Stopband Corner Frequency A($\omega$) >54 dB | | 300 | | kHz |

Audio Output Buffer (ABUF)

Table 26 lists the operating parameters of audio output buffer (ABUF) 466 in accordance with a preferred embodiment of the present invention. The audio is at an internal level of 0.1 volts peak to peak. ABUF 466 converts this signal to a current via a linear transconductance amplifier which then drives a load resistor. Feedback is arranged via an external signal to allow for continuous adjustment of the gain and offset of the amplifier so that no AC coupling is required to the next stage. An on-chip integrator is used to define the feedback level and reject the audio signal.

The control signal AOUT MODE 467 enables on-chip loads of 600 Ω, 10 kΩ or no load, which equates to a current source output. The control signal AUDIO MUTE 468 controls an audio mute switch which disables the output.

TABLE 26

ABUF Specifications

| Parameter | Description | Min | Typ | Max | Unit |
|---|---|---|---|---|---|
| $V_{Video}$ | Audio Input Level | | 0.1 | | V (p-p) |
| $V_{OV}$ | Audio Output Level ($R_L$ >500Ω) | | 0.35 | | V (p-p) |
| $V_{OVR}$ | Audio Output DC Reference ($R_L$ > 500Ω) | 0.5 | | 3.5 | V |
| $Z_{OUT}$ | Output Impedance 600Ω Mode | 588 | 600 | 612 | Ω |
| $Z_{OUT}$ | Output Impedance 10 kΩ Mode | 9.8 | 10.0 | 10.2 | kΩ |
| $Z_{OUT}$ | Output Impedance Current Mode | | 100 | | kΩ |

Serial Digital Interface

Tables 27-29 define the registers, register bits and bit functions that are addressable by serial digital interface 170 in accordance with a preferred embodiment of the present invention. For example, control and status may be performed via an inter integrated Circuit ($I^2$) bus interface. Serial digital interface 170 contains all registers and provides access to all parallel digital on-chip functions via the serial bus.

TABLE 27

Register Definition

| Register Name | Description | Register Address | Read/Write |
|---|---|---|---|
| FREQ0 | Frequency - Low byte | 00 | Read/Write |
| FREQ1 | Frequency - High byte | 01 | Read/Write |
| CTRL0 | Functional control | 02 | Read/Write |
| CTRL1 | Functional control | 03 | Read/Write |
| STAT0 | Functional status | 04 | Read |
| STAT1 | Functional status | 05 | Read |
| STAT2 | Functional status | 06 | Read |
| CMPY0 | Company code - Low byte | 07 | Read |
| CMPY1 | Company code - High byte | 08 | Read |
| REV0 | Revision code - Low byte | 09 | Read |
| REV1 | Revision code - High byte | 0A | Read |

The definitions of the bits used in each register are.

TABLE 28

Register Bit Definitions

| Register | Bit 7 | Bit 6 | Bit 5 | Bit 4 | Bit 3 | Bit 2 | Bit 1 | Bit 0 |
|---|---|---|---|---|---|---|---|---|
| FREQ0 | F7 | F6 | F5 | F4 | F3 | F2 | F1 | F0 |
| FREQ1 | F15 | F14 | F13 | F12 | F11 | F10 | F9 | F8 |
| CTRL0 | PWRDN | AMUTE | VMUTE | | MODE3 | MODE2 | MODE1 | MODE0 |
| CTRL1 | | | | | VRS1 | VRS0 | ARS1 | ARS0 |
| STAT0 | RLOCK | FLOCK | | | | AFC2 | AFC1 | AFC0 |
| STAT1 | | | | | RSSI3 | RSSI2 | RSSI1 | RSSI0 |
| STAT2 | T7 | T6 | T5 | T4 | T3 | T2 | T1 | T0 |
| CMPY0 | C7 | C6 | C5 | C4 | C3 | C2 | C1 | C0 |
| CMPY1 | C15 | C14 | C13 | C12 | C11 | C10 | C9 | C8 |
| REV0 | R7 | R6 | R5 | R4 | R3 | R2 | R1 | R0 |
| REV1 | R15 | R14 | R13 | R12 | R11 | R10 | R9 | R8 |

The status registers are read only. Attempting to write a status register will have no effect. The function of each bit is defined as:

TABLE 29

Bit Functions

| Bit Name | Function | Description |
|---|---|---|
| F0-15 | Receiver frequency | f = 0.0625 · F + $k_f$ (MHz) (F15 = MSB, F0 = LSB) |
| PWRDN | Circuit power-down | When high the receiver is disabled, the video and audio outputs are muted and the I²C remains functional. The circuit draws minimum current. |
| AMUTE | Audio mute | Audio output is disabled when high. |
| VMUTE | Video mute | Video output is disabled when high. |
| MODE0-3 | Receiver mode select | Selects receiver operating mode (unused, reserved for NTSC/PAL/SECAM switching). |
| VRS0-1 | Video output impedance select | 00 = 75Ω, 01 = 1 kΩ, 02 = Current Source. |
| ARS0-1 | Audio output impedance select | 00 = 600Ω, 01 = 10 kΩ, 02 = Current Source. |
| RLOCK | Receiver lock | High if AFC is locked to incoming signal |
| FLOCK | Synthesizer lock | High if frequency synthesizer locked |
| AFC0-2 | AFC offset | Indicates magnitude and direction of mistuning of receiver. Three MSB's of AFC counter. |
| RSSI0-3 | Received signal strength indicator | Indicates relative signal strength of signal. 0000 is no effective signal, 1111 is large signal. (RSSI3 = MSB, RSSI0 = LSB) |
| T0-7 | Test data | Data used for test purposes only. |
| C0-15 | Company code | Unique identifier for Cirrus Logic I²C parts |
| R0-15 | Revision code | Unique identifier for part number and revision |

Bias and Control (BC)

Table 30 lists the operating parameters of bias and control logic (BC) 180 in accordance with a preferred embodiment of the present invention. Bias voltages and currents are generated to define specific levels need for each circuit element in the present invention. The control signal POWERDOWN 476 controls the power-down function via BC 180.

TABLE 30

BC Specifications

| Parameter | Description | Min | Typ | Max | Unit |
|---|---|---|---|---|---|
| $F_{OSC}$ | Crystal Oscillator Frequency Reference | | 8 | | MHz |

Although the present invention and its advantages have been described in detail, it should be understood that various changes, substitutions and alterations can be made herein without departing from the spirit and scope of the invention as defined by the appended claims.

What is claimed is:

1. A television receiver comprising:
   a receiver input coupled to an RF signal source;
   a first reference signal having a first operating frequency;
   a first mixer having a first input coupled to said receiver input and a second input coupled to said first reference signal;
   a second reference signal having a second operating frequency; and
   a second mixer having a first input coupled directly to an output of said first mixer and a second input coupled to said second reference signal, wherein said second mixer is an image rejection mixer.

2. The television receiver as set forth in claim 1 wherein said first mixer is a subtractive mixer.

3. The television receiver as set forth in claim 2 wherein a minimum frequency value of said first reference signal is greater than an input cutoff frequency of an RF signal received from said RF signal source.

4. The television receiver as set forth in claim 1 wherein said first operating frequency is variable between a minimum frequency value and a maximum frequency value.

5. The television receiver as set forth in claim 4 wherein said first mixer subtractively mixes said first reference signal and an RF signal received from said RF signal source to thereby generate a first IF signal on said first mixer output.

6. The television receiver as set forth in claim 5 wherein a selected carrier frequency in said RF signal appears at a first predetermined frequency in said first IF signal.

7. The television receiver as set forth in claim 6 wherein said first predetermined frequency is 1200 Megahertz.

8. The television receiver as set forth in claim 6 wherein said selected carrier frequency is selected by varying said first operating frequency.

9. The television receiver as set forth in claim 1 wherein said first mixer is coupled to said receiver input by an input filter which filters out all frequency components in said RF signal above an input cutoff frequency.

10. The television receiver as set forth in claim 9 wherein said minimum frequency value of said first reference signal is greater than said input cutoff frequency.

11. The television receiver as set forth in claim 6 wherein said second mixer mixes said second reference signal and said first IF signal to thereby generate a second IF signal containing all of the channels of information as contained in said RF signal.

12. The television receiver as set forth in claim 11 wherein said second operating frequency is fixed.

13. The television receiver as set forth in claim 12 wherein said second mixer rejects from said second IF signal an image signal of said second reference signal.

14. The television receiver as set forth in claim 13 wherein said selected carrier frequency in said RF signal appears at a second predetermined frequency in said second IF signal.

15. The television receiver as set forth in claim 13 wherein said minimum frequency value of said first reference signal is greater than an input cutoff frequency of said RF signal.

16. The television receiver as set forth in claim 1 further comprising a first IF signal generated by said first mixer wherein said second mixer mixes said second reference signal and said first IF signal to generate a second IF signal containing all of the channels of information as contained in an RF signal received from said RF signal source.

17. The television receiver as set forth in claim 16 wherein said second operating frequency is fixed.

18. The television receiver as set forth in claim 17 wherein said second mixer rejects from said second IF signal an image signal of said first IF signal.

19. The television receiver as set forth in claim 18 wherein a selected carrier frequency in an RF signal received from said RE signal source appears at a first predetermined frequency in said first IF signal and at a second predetermined frequency in said second IF signal.

20. The television receiver as set forth in claim 19 wherein said second predetermined frequency is a difference in frequency between said first predetermined frequency and said second operating frequency.

21. The television receiver as set forth in claim 20 wherein said second operating frequency is less than said first predetermined frequency and the frequency of said image signal rejected by said second mixer is less than said second operating frequency by an amount equal to said second predetermined frequency.

22. The television receiver as set forth in claim 20 wherein said first predetermined frequency is 1200 Megahertz, said second operating frequency is 1180 Megahertz, and said second predetermined frequency is 20 Megahertz.

23. A television receiver comprising:

a receiver input coupled to an RF signal source;

a first mixer physically located on an integrated circuit substrate having a first input coupled to said receiver input and a second input coupled to a first reference signal having a first operating frequency, wherein said first operating frequency is variable between a minimum frequency value and a maximum frequency value; and a second mixer physically located on the same integrated circuit substrate as the first mixer and having a first input directly coupled without leaving the substrate to an output of said first mixer and a second input coupled to a second reference signal having a second operating frequency, wherein said second operating frequency is fixed.

24. The television receiver as set forth in claim 23 wherein said minimum frequency value is greater than an input cutoff frequency of an RF signal received from said RF signal source.

25. The television receiver as set forth in claim 24 wherein said first mixer subtractively mixes said RF signal and said first reference signal to thereby produce a first IF signal, wherein a selected carrier frequency in said RF signal appears at a first predetermined frequency in said first IF signal and said first predetermined frequency is greater than said selected carrier frequency.

26. The television receiver as see forth in claim 25 wherein said second mixer mixes said first IF signal and said second reference signal to thereby produce a second IF signal, wherein said selected carrier frequency appears in said second IF signal at a second predetermined frequency and said second predetermined frequency is less than said first predetermined frequency and said second operating frequency.

27. The television receiver as set forth in claim 26 wherein said second mixer rejects at least one image signal associated with said second operating frequency from said second IF signal.

28. A method of processing a received RF signal, the method comprising the steps of:

mixing the RF signal with a first reference signal having a first operating frequency to thereby produce a first IF signal; and mixing the first IF signal with a second reference signal having a second operating frequency to thereby produce a second IF signal, said mixing of the first IF signal with the second reference signal occurring prior to eliminating any channels from the first IF signal, wherein said RF signal mixing and said first IF signal mixing operations are accomplished on the same integrated circuit substrate.

29. The method as set forth in claim 28 including the further step of filtering out of the RF signal all frequency components above an input cutoff frequency.

30. The method as set forth in claim 29 wherein the first operating frequency is greater than the input cutoff frequency.

31. The method as set forth in claim 30 wherein the step of mixing the RF signal with the first reference signal is a subtractive mixing of the RF signal and the first reference signal.

32. The method as set forth in claim 31 wherein the step of mixing the RF signal with the first reference signal is an up-conversion mixing, wherein a selected carrier frequency in the RF signal appears in the first IF signal at a frequency higher than the RF signal.

33. The method as set forth in claim 28 wherein the step of mixing the first IF signal with the second reference signal further includes the substep of removing from the second IF signal at lease one image signal associated with the first IF signal.

34. A method of processing a received RF signal, the method comprising the steps of:

filtering all frequency components above an input cutoff frequency out of the received RF signal to thereby produce a first filtered signal;

amplifying the first filtered signal;

subtractively mixing the amplified first filtered signal with a first reference signal having a first operating frequency to thereby produce a first IF signal; and mixing the first IF signal with a second reference signal having a second operating frequency to thereby produce a second IF signal, said mixing of the first IF signal with the second reference signal occurring prior to eliminating any channels from the first IF signal.

35. The method as set forth in claim 34 wherein the first operating frequency is greater than the input cutoff frequency.

36. The method as set forth in claim 35 wherein the step of mixing the RF signal with the first reference signal is an up-conversion mixing, wherein a selected carrier signal in the RF signal appears in the first IF signal at a first predetermined frequency and wherein the first predetermined frequency is higher than the RF signal.

37. The method as set forth in claim 34 wherein the step of mixing the first IF signal with the second reference signal further includes the substep of removing from the second IF signal at least one image signal associated with the first IF signal.

38. The method as set forth in claim 34 wherein the step of mixing the first IF signal with the second reference signal is a down conversion mixing, wherein a selected carrier signal appearing in the first IF signal at a first predetermined frequency appears in the second IF signal at a second predetermined frequency and wherein the second predetermined frequency is lower than the first IF signal.

39. The method as set forth in claim 34 including the further step of filtering the second IF signal with a bandpass filter.

40. The method as set forth in claim 39 wherein the bandpass filter has a passband between 15 Megahertz and 21 Megahertz.

41. The method as set forth in claim 39 wherein the bandpass filter is a Nyquist slope filter having a cutoff frequency of 20 Megahertz.

42. A television receiver comprising:

an input filter coupled to an RF signal source;

a first amplifier coupled to an output of said input filter;

a first mixer having a first input and a second input, wherein said first input of said first mixer is coupled to an output of said first amplifier;

a first oscillator coupled to said second input of said first mixer, wherein said first oscillator generates a first reference signal having a first operating frequency;

a second mixer having a first input and a second input, wherein said first input of said second mixer is coupled directly to an output of said first mixer without the connection of a filter therebetween;

a second oscillator coupled to said second input of said second mixer, wherein said second oscillator generates a second reference signal having a second operating frequency; and a second filter coupled to an output of said second mixer.

43. The television receiver as set forth in claim 42 wherein said input filter is a low-pass filter having a −3 dB cutoff frequency of 900 Megahertz.

44. The television receiver as set forth in claim 42 wherein said first amplifier is a transconductance amplifier having a noise figure between 4.5 dB and 5.4 dB.

45. The television receiver as set forth in claim 42 wherein the gain of said first amplifier is automatically controlled by an automatic gain control circuit of said television receiver.

46. The television receiver as set forth in claim 42 wherein said first mixer is an up-converter which subtractively mixes a filtered and amplified RF signal having a maximum cutoff frequency with said first reference signal to thereby generate a first IF signal, wherein a lower limit of said first operating frequency is greater than said maximum cutoff frequency.

47. The television receiver as set forth in claim 42 wherein said first oscillator is a phase-locked synthesizer and said first operating frequency has an upper limit of 2100 Megahertz and a lower limit of 1200 Megahertz.

48. The television receiver as set forth in claim 42 wherein said second mixer is an image-rejection mixer which down-converts a first IF signal outputted from said first mixer to thereby generate a second IF signal.

49. The television receiver as set forth in claim 42 wherein said second oscillator is a fixed tuned-frequency synthesizer and said second operating frequency is approximately 1180 Megahertz.

50. The television receiver as set forth in claim 42 wherein said second filter is a bandpass filter having an upper passband limit of 20.75 Megahertz and a lower passband limit of 15.8 Megahertz.

51. The television receiver as set forth in claim 42 wherein said second filter is a Nyquist slope filter.

52. The television receiver as set forth in claim 51 wherein said second filter has a −6 dB gain point at a visual carrier frequency of an IF signal generated by said second mixer.

53. The television receiver as set forth in claim 52 wherein said visual carrier frequency is approximately 20 Megahertz and said second filter has a passband corner frequency of approximately 19.25 Megahertz.

54. The television receiver as set forth in claim 52 wherein said second filter is automatically tuned by measuring the level of synchronization pulses on a input of said second filter and on an output of said second filter and adjusting a cut-off frequency of said second filter so that there is a 6 dB loss on said output of said second filter.

55. The television receiver as set forth in claim 42 wherein said television receiver further comprises:

a second amplifier coupled to an output of said second filter.

56. The television receiver as set forth in claim 55 wherein the gain of said second amplifier is automatically controlled by an automatic gain control circuit of said television receiver.

57. The television receiver as set forth in claim 55 wherein said television receiver further comprises:

a third filter coupled to an output of said second amplifier, wherein said third filter is a bandpass filter for extracting a video carrier signal from an output signal of said second amplifier; and a third mixer having a first input and a second input, wherein said first input of said third mixer is coupled to said output of said second amplifier and said second input of said third mixer is coupled to an output of said third filter and wherein an output signal on an output of said third mixer is a video baseband signal.

58. The television receiver as set forth in claim 57 wherein said second input of said third mixer is coupled to said third filter by amplitude limiting circuitry, wherein said amplitude limiting circuitry provides a fixed-amplitude reference carrier signal to said third mixer.

59. The television receiver as set forth in claim 57 wherein said television receiver further comprises frequency detection circuitry having a first input and a second input, wherein said first input of said frequency detection circuitry is coupled to said output of said third filter and said second input of said frequency detection circuitry is coupled to a third reference signal having a third operating frequency.

60. The television receiver as set forth in claim 59 wherein said frequency detection circuitry compares the frequency of said video carrier signal to said third operating frequency to thereby produce an output control signal, wherein said output control signal is used to control said first operating frequency of said first reference signal generated by said first oscillator.

61. The television receiver as set forth in claim 57 wherein said television receiver further comprises a fourth filter coupled to said output of said third mixer and wherein said fourth filter is a low-pass filter that cuts off all signal components higher in frequency than said video baseband signal.

62. The television receiver as set forth in claim 61 wherein said television receiver further includes a clamping circuit for clamping synchronization pulses in said video baseband signal from said fourth filter.

63. The television receiver as set forth in claim 62 wherein said television receiver further comprises a noise inverter circuit coupled to said clamping circuit, wherein said noise inverter circuit removes transient noise pulses from said video baseband signal.

64. The television receiver as set forth in claim 63 wherein said transient noise pulses comprise transient noise pulses that cause said video baseband signal to drop below a blanking level of said video baseband signal.

65. The television receiver as set forth in claim 63 wherein said transient noise pulses comprise transient noise pulses that cause said video baseband signal to rise above a 108 IRE white level of said video baseband signal.

66. The television receiver as set forth in claim 57 wherein said television receiver further comprises an automatic gain control circuit coupled to said output of said third mixer, wherein said automatic gain control circuit controls the gain of said second amplifier.

67. The television receiver as set forth in claim 66 wherein said automatic gain control circuit controls the gain of said first amplifier.

68. The television receiver as set forth in claim 66 wherein said automatic gain control circuit comprises a sample-and-hold circuit coupled to a first input of a differential amplifier.

69. The television receiver as set forth in claim 68 wherein a second input of said differential amplifier is coupled to a reference voltage equal to an output blanking level of a standard NTSC video baseband signal.

70. The television receiver as set forth in claim 57 wherein said television receiver further comprises a video output buffer amplifier coupled to said output of said third mixer.

71. The television receiver as set forth in claim 70 wherein said video output buffer amplifier comprises a linear transconductance amplifier.

72. The television receiver as set forth in claim 71 wherein said video output buffer amplifier further comprises blanking means for setting an output signal of said video output buffer amplifier to a video blanking level.

73. The television receiver as set forth in claim 72 wherein said video output buffer amplifier further comprises switching means for varying an output load of said video output buffer amplifier.

74. The television receiver as set forth in claim 55 wherein said television receiver further comprises a third filter coupled to an output of said second amplifier, wherein said third filter is a narrow-band filter for filtering an audio component signal from a video output signal on said output of said second amplifier.

75. The television receiver as set forth in claim 74 wherein said third filter has a center frequency of 15.5 Megahertz and a band width of 300 Kilohertz.

76. The television receiver as set forth in claim 74 wherein said television receiver further comprises:
   audio phase detector circuitry coupled to an output of said third filter; and
   a third mixer having a first input and a second input, wherein said first input of said third mixer is coupled to said output of said third filter and said second input of said third mixer is coupled to an output of said audio phase detector circuitry.

77. The television receiver as set forth in claim 76 wherein said audio phase detector circuitry comprises a delay-locked loop, wherein an output signal of said delay-locked loop operates in phase quadrature with a center frequency of said audio component signal on said output of said third filter.

78. The television receiver as set forth in claim 76 wherein said television receiver further comprises a fourth filter coupled to an output of said third mixer, wherein said fourth filter is a low-pass filter with a cut-off frequency of 120 Kilohertz.

79. The television receiver as set forth in claim 76 wherein said television receiver further comprises an audio output buffer amplifier coupled to an output of said third mixer.

80. The television receiver as set forth in claim 79 wherein said audio output buffer amplifier comprises a linear transconductance amplifier.

81. The television receiver as set forth in claim 79 wherein said audio output buffer amplifier further comprises muting means for setting an output signal of said audio output buffer amplifier to zero volts.

82. The television receiver as set forth in claim 80 wherein said audio output buffer amplifier further comprises switching means for varying an output load of said audio output buffer amplifier.

83. A television receiver comprising:
   a receiver input coupled to an RF signal source;
   a first reference signal having a first operating frequency;
   a first mixer having a first input coupled to said receiver input and a second input coupled to said first reference signal;
   a first bandpass filter coupled to an output of said first mixer; the bandpass filter passing more than one channel and performing partial image rejection as well as limiting overall signal power levels to be processed by subsequent circuitry;
   a second reference signal having a second operating frequency; and
   an image rejection mixer having a first input coupled to an output of said first bandpass filter and a second input coupled to said second reference signal.

84. The television receiver as set forth in claim 83 wherein said first mixer is a subtractive mixer.

85. The television receiver as set forth in claim 84 wherein a minimum frequency value of said first reference signal is greater than an input cutoff frequency of an RF signal outputted from said RF signal source.

86. The television receiver as set forth in claim 83 wherein said first operating frequency is variable between a minimum frequency value and a maximum frequency value.

87. The television receiver as see forth in claim 86 wherein said first mixer subtractively mixes said first reference signal and an RF signal outputted from said RF signal source to thereby generate a first IF signal on said first mixer output.

88. The television receiver as set forth in claim 87 wherein a selected carrier frequency in said RF signal appears at a first predetermined frequency in said first IF signal.

89. The television receiver as set forth in claim 88 wherein said first predetermined frequency is 1200 Megahertz.

90. The television receiver as set forth in claim 88 wherein said selected carrier frequency is selected by varying said first operating frequency.

91. The television receiver as set forth in claim 87 wherein said first mixer is coupled to said receiver input by an input filter which filters out all frequency components in said RF signal above an input cutoff frequency.

92. The television receiver as set forth in claim 91 wherein said minimum frequency value of said first reference signal is greater than said input cutoff frequency.

93. The television receiver as set forth in claim 88 wherein said second mixer mixes said second reference signal and a first filtered signal on said output of said first bandpass filter to thereby generate a second IF signal.

94. The television receiver as set forth in claim 93 wherein said second operating frequency is fixed.

95. The television receiver as set forth in claim 94 wherein said selected carrier frequency in said RF signal appears at a second predetermined frequency in said second IF signal.

96. The television receiver as set forth in claim 94 wherein said minimum frequency value of said first reference signal is greater than an input cutoff frequency of said RF signal.

97. A television receiver comprising:
   a receiver input coupled to an RF signal source;
   a first mixer having a first input coupled to said receiver input and a second input coupled to a first reference signal having a first operating frequency, wherein said first operating frequency is variable between a minimum frequency value and a maximum frequency value;
   a first bandpass filter constructed in the same substrate as said first mixer and coupled to an output of said first mixer; and
   a second mixer having a first input coupled to an output of said first bandpass filter and a second input coupled to a second reference signal having a second operating frequency, wherein said second operating frequency is fixed.

98. The television receiver as set forth in claim 97 wherein said minimum frequency value is greater than an input cutoff frequency of an RF signal outputted from said RF signal source.

99. The television receiver as set forth in claim 98 wherein said first mixer subtractively mixes said RF signal and said first reference signal to thereby produce a first IF signal, wherein a selected carrier frequency in said RF signal appears at a first predetermined frequency in said first IF signal and said first predetermined frequency is greater than said selected carrier frequency.

100. The television receiver as set forth in claim 99 wherein said selected carrier frequency appears at said first predetermined frequency in an output passband signal of said bandpass filter.

101. The television receiver as set forth in claim 100 wherein said second mixer mixes said output passband signal and said second reference signal to thereby produce a second IF signal, wherein said selected carrier frequency appears in said second IF signal at a second predetermined frequency and said second predetermined frequency is less than said first predetermined frequency and said second operating frequency.

102. A method of processing a received RF signal, the method comprising the steps of:
   mixing the RF signal with a first reference signal having a first operating frequency to thereby produce a first IF signal;
   filtering the first IF signal in a first bandpass filter to produce an output passband signal having at least four channels; and
   mixing the output passband signal with a second reference signal having a second operating frequency to thereby produce a second IF signal.

103. The method as set forth in claim 102 including the further step of filtering out of the RF signal all frequency components above an input cutoff frequency.

104. The method as set forth in claim 103 wherein the first operating frequency is greater than the input cutoff frequency.

105. The method as set forth in claim 104 wherein the step of mixing the RF signal with the first reference signal is a subtractive mixing of the RF signal and the first reference signal.

106. The method as see forth in claim 105 wherein the step of mixing the RF signal with the first reference signal is an up-conversion mixing, wherein a selected carrier frequency in the RF signal appears in the first IF signal at a first predetermined frequency and wherein the first predetermined frequency is higher than the selected carrier frequency.

107. The method as set forth in claim 106 wherein the first predetermined frequency appears in the output passband signal of the first bandpass filter.

108. A method of processing a received RF signal, the method comprising the steps of:
   filtering all frequency components above an input cutoff frequency out of the received RF signal to thereby produce a first filtered signal;
   amplifying the first filtered signal;
   subtractively mixing the amplified first filtered signal with a first reference signal having a first operating frequency to thereby produce a first IF signal;
   filtering the first IF signal in a bandpass filter to produce an output passband signal having at least four channels; and
   mixing the output passband signal with a second reference signal having a second operating frequency to thereby produce a second IF signal.

109. The method as set forth in claim 108 wherein the first operating frequency is greater than the input cutoff frequency.

110. The method as set forth in claim 109 wherein the step of mixing the amplified first filtered signal with the first reference signal is an up-conversion mixing, wherein a selected carrier signal in said received RF signal appears in the first IF signal at a first predetermined frequency and wherein said first predetermined frequency is higher than the selected carrier frequency.

111. The method as set forth in claim 110 wherein the selected carrier signal appears in the output passband signal at the first predetermined frequency.

112. The method as set forth in claim 108 wherein the step of mixing the output passband signal with the second reference signal is a down conversion mixing, wherein a selected carrier signal appearing at a first predetermined frequency in the output passband signal appears in the second IF signal at a second predetermined frequency and wherein said second predetermined frequency is lower than said first predetermined frequency.

113. The method as set forth in claim 108 including the further step of filtering the second IF signal with a second bandpass filter.

114. The method as set forth in claim 113 wherein the second bandpass filter has a passband between 15 Megahertz and 21 Megahertz.

115. The method as set forth in claim 114 wherein the second bandpass filter is a Nyquist slope filter having a cutoff frequency of 20 Megahertz.

116. The method of extracting a single communications channel from a large number of such channels wherein each such channel has a defined frequency range, and wherein the large number of channels are communicated within an upper and a lower frequency boundary, the method comprising the steps of:
   from an input signal containing all of the large number of channels removing all frequencies greater than the upper frequency boundary;
   translating all of the channels contained within the input signal to a translated frequency range such that a desired single channel to be extracted from the input signal is positioned centrally within the translated frequency range, the translated frequency range being positioned at frequencies higher than the upper frequency boundary;
   removing from the translated input signal all channels extending from the center of the translated frequency range four channels or more in each frequency direction;
   translating the remaining channels within the input signal to a second translated frequency range, such that the desired single channel to be extracted from the input signal is positioned centrally within the second translated frequency range having a low end frequency boundary defined as high enough not to cause phase distortion in any subsequent filtering and a high end frequency boundary defined as a frequency beyond which a filter with proper bandwidth, noise and distortion can be integrated in a substrate; and
   removal of all remaining frequencies which are not part of the desired single channel.

117. The method set forth in claim 116 wherein the last-mentioned removal step includes a receiver attenuation characteristic such that the relative amplitude of low and high frequencies within the desired single channel are corrected for vestigial sideband demodulation.

118. The method set forth in claim 116 wherein the low end and high end boundaries of the second translated frequency range are defined by the implementation of an integrated circuit continuous time filter capable of achieving single channel TV signal extraction and receiver attenuation characteristics.

119. The television receiver as set forth in claim 42 wherein said input filter limits the frequencies passed to those at or below the highest channel in a desired frequency band.

120. A television receiver comprising:

a receiver input for receiving an RF signal;

an input filter coupled to said receiver input and operating to remove all frequency components in said RF signal above an input cutoff frequency to produce a filtered RF signal;

a first reference signal having a first operating frequency;

a first mixer having a first input coupled to an output of said input filter and a second input coupled to said first reference signal;

a second reference signal having a second operating frequency; and a second mixer having a first input coupled to an output of said first mixer and a second input coupled to said second reference signal, wherein said second mixer is an image rejection mixer.

121. The television receiver of claim 120 wherein said first operating frequency is variable between a minimum frequency value and a maximum frequency value.

122. The television receiver of claim 121 wherein said minimum frequency value is greater than said input cutoff frequency.

123. The television receiver of claim 120 wherein said first mixer subtractively mixes said first reference signal and said filtered RF signal to thereby generate a first IF signal at said first mixer output.

124. The television receiver of claim 120 wherein said second mixer mixes a first IF signal from said first mixer and said second reference signal to generate a second IF signal and wherein said second mixer rejects an image signal of said second reference signal from said second IF signal.

125. The television receiver of claim 120 wherein said second mixer mixes a first IF signal from said first mixer and said second reference signal to generate a second IF signal and wherein said second mixer rejects an image signal of said first IF signal from said second IF signal.

126. The television receiver of claim 120 wherein said first mixer generates a first IF signal and wherein a selected carrier frequency in said RF signal appears at a first predetermined frequency in said first IF signal.

127. The television receiver of claim 126 wherein said second mixer generates a second IF signal and wherein said selected carrier frequency in said RF signal appears at a second predetermined frequency in said second IF signal.

128. The television receiver of claim 120 wherein said first mixer and said second mixer are physically located on the same integrated circuit substrate.

* * * * *

EX PARTE REEXAMINATION CERTIFICATE (5596th)
United States Patent
Rotzoll (12)

(10) Number: US 5,737,035 C1
(45) Certificate Issued: Nov. 7, 2006

(54) HIGHLY INTEGRATED TELEVISION TUNER ON A SINGLE MICROCIRCUIT

(75) Inventor: Robert Rudolf Rotzoll, Allen, TX (US)

(73) Assignee: Microtune (Texas), L.P., Plano, TX (US)

Reexamination Request:
No. 90/006,833, Oct. 28, 2003

Reexamination Certificate for:
Patent No.: 5,737,035
Issued: Apr. 7, 1998
Appl. No.: 08/426,080
Filed: Apr. 21, 1995

(51) Int. Cl.
*H04N 5/44* (2006.01)

(52) U.S. Cl. .................. 348/725; 348/731; 455/315; 455/339

(58) Field of Classification Search ............. 348/725, 348/731, 726; 455/315, 339, 302, 179.1; H04N 5/44
See application file for complete search history.

(56) References Cited

U.S. PATENT DOCUMENTS

| | | | | |
|---|---|---|---|---|
| 3,939,429 A | * | 2/1976 | Lohn et al. | 455/255 |
| 3,962,640 A | * | 6/1976 | Bomba | 455/182.2 |
| 4,318,130 A | * | 3/1982 | Heuer | 348/733 |
| 4,491,976 A | * | 1/1985 | Saitoh et al. | 455/315 |
| 4,642,675 A | * | 2/1987 | Gassmann | 348/727 |
| 4,855,835 A | * | 8/1989 | Tobita | 348/735 |
| 4,929,905 A | * | 5/1990 | Ruitenburg | 329/358 |
| 5,200,826 A | | 4/1993 | Seong | |
| 5,325,401 A | * | 6/1994 | Halik et al. | 375/329 |
| 5,398,080 A | | 3/1995 | Sakashita et al. | |

FOREIGN PATENT DOCUMENTS

DE     3226980 A1 *    1/1984

OTHER PUBLICATIONS

Ducourant, T. et al., "A 3 Chip GaAs Double Conversion TV Tuner System With 70 dB Image Rejection," *IEEE 1989 Microwave and Millimeter–Wave Monolithic Circuits Symposium*, pp. 87–90 (1989).

Okanobu, T. et al., "Advanced Low Voltage Single Chip Radio IC," *IEEE Transactions on Consumer Electronics*, vol. 38, No. 3, Aug. 1992, pp. 465–475.

* cited by examiner

*Primary Examiner*—Michael H. Lee

(57) ABSTRACT

There is disclosed a fully integrated television receiver for receiving a standard antenna or cable input and outputting a standard video baseband signal and a standard audio baseband signal. The receiver employs an up-conversion mixer and a down-conversion image-rejection mixer in series to produce an on-chip IF signal. Audio detection of the IF signal is performed via an audio delay-locked loop operating in quadrature to the audio FM signal. Video detection of the IF signal is performed by frequency mixing the IF signal with the extracted video carrier of the IF signal. Variable load drive capability is provided for both the video output and the audio output.

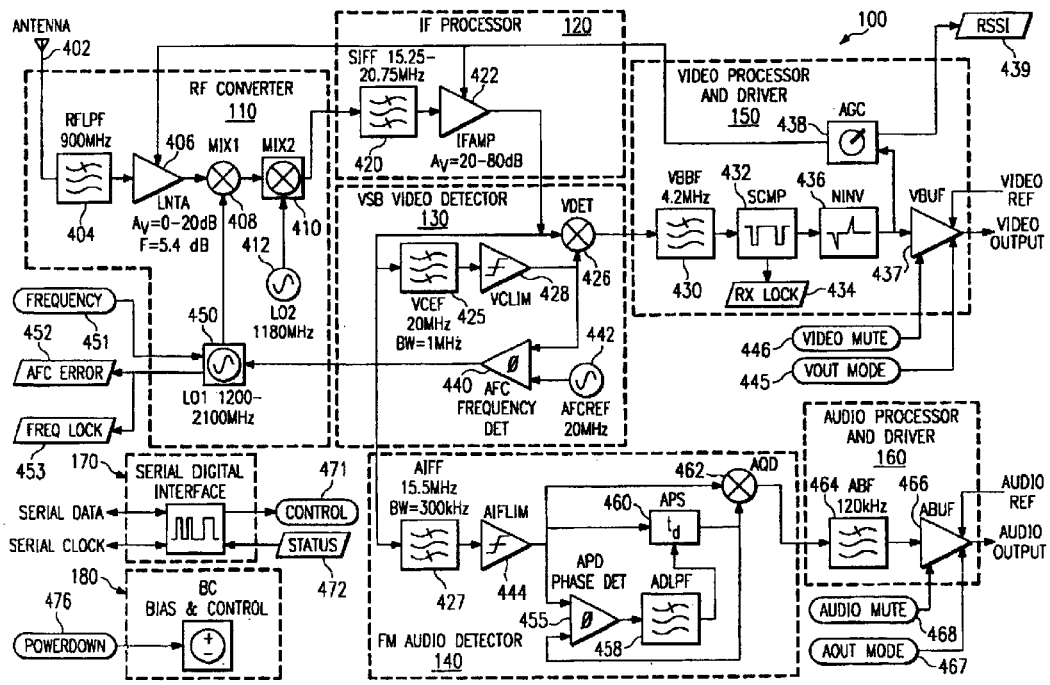

US 5,737,035 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–41 is confirmed.

Claim 128 is cancelled.

Claims 42, 83, 97, 102, 108, 116 and 120 are determined to be patentable as amended.

Claims 43–82, 84–96, 98–101, 103–107, 109–115, 117–119 and 121–127, dependent on an amended claim, are determined to be patentable.

New claims 129–164 are added and determined to be patentable.

42. A television receiver comprising:
an input filter coupled to an RF signal source;
a first amplifier coupled to an output of said input filter;
a first mixer having a first input and a second input, wherein said first input of said first mixer is coupled to an output of said first amplifier;
a first oscillator coupled to said second input of said first mixer, wherein said first oscillator generates a first reference signal having a first operating frequency;
a second mixer having a first input and a second input, wherein said first input of said second mixer is coupled directly to an output of said first mixer without the connection of a filter therebetween, *wherein said second mixer comprises an image reject mixer, and wherein said first mixer and said second mixer are physically located in the same integrated circuit substrate*;
a second oscillator coupled to said second input of said second mixer, wherein said second oscillator generates a second reference signal having a second operating frequency; and
a second filter coupled to an output of said second mixer.

83. A television receiver comprising:
a receiver input coupled to an RF signal source;
a first reference signal having a first operating frequency;
a first mixer having a first input coupled to said receiver input and a second input coupled to said first reference signal;
a first *passive* bandpass filter coupled to an output of said first mixer; the bandpass filter passing more than one channel and performing partial image rejection as well as limiting overall signal power levels to be processed by subsequent circuitry, *wherein the more than one channel passed by the bandpass filter is attenuated*;
a second reference signal having a second operating frequency; and
an image rejection mixer having a first input coupled to an output of said first bandpass filter and a second input coupled to said second reference signal.

97. A television receiver comprising:
a receiver input coupled to an RF signal source;
a first mixer having a first input coupled to said receiver input and a second input coupled to a first reference signal having a first operating frequency, wherein said first operating frequency is variable between a minimum frequency value and a maximum frequency value;
a first bandpass filter constructed in the same *integrated circuit* substrate as said first mixer and coupled to an output of said first mixer; and
a second mixer having a first input coupled to an output of said first bandpass filter and a second input coupled to a second reference signal having a second operating frequency, wherein said second operating frequency is fixed, *wherein said first mixer and said second mixer comprise a differential mixer chain.*

102. A method of processing a received RF signal, the method comprising the steps of:
mixing the RF signal with a first reference signal having a first operating frequency to thereby produce a first IF signal;
*controlling a frequency of said first operating frequency for said mixing the RF signal using a digital interface;*
filtering the first IF signal in a first bandpass filter to produce an output passband signal having at least four channels; and
mixing the output passband signal with a second reference signal having a second operating frequency to thereby produce a second IF signal, *wherein said mixing the RF signal and said mixing the output passband signal are performed in a single integrated circuit.*

108. A method of processing a received RF signal *using a television tuner*, the method comprising the steps of:
filtering all frequency components above an input cutoff frequency out of the received RF signal to thereby produce a first filtered signal;
amplifying the first filtered signal;
subtractively mixing the amplified first filtered signal with a first reference signal having a first operating frequency to thereby produce a first IF signal;
filtering the first IF signal in a bandpass filter to produce an output passband signal having at least four channels; and
mixing the output passband signal with a second reference signal having a second operating frequency to thereby produce a second IF signal.

116. The method of extracting a single communications channel from a large number of such channels wherein each such channel has a defined frequency range, and wherein the large number of channels are communicated within an upper and a lower frequency boundary, the method comprising the steps of:
from an input signal containing all of the large number of channels removing all frequencies greater than the upper frequency boundary;
translating all of the channels contained within the input signal to a translated frequency range such that a desired single channel to be extracted from the input signal is positioned centrally within the translated frequency range, the translated frequency range being positioned at frequencies higher than the upper frequency boundary;

removing from the translated input signal all channels extending from the center of the translated frequency range four channels or more in each frequency direction;

translating the remaining channels within the input signal to a second translated frequency range, such that the desired single channel to be extracted from the input signal is positioned centrally within the second translated frequency range having a low end frequency boundary defined as high enough not to cause phase distortion in any subsequent filtering and a high end frequency boundary defined as a frequency beyond which a filter with proper bandwidth, noise and distortion can be integrated in a substrate; and

[removal] *removing* of all remaining frequencies which are not part of the desired single channel.

120. A television receiver comprising:

a receiver input for receiving an RF signal;

an input filter coupled to said receiver input and operating to remove all frequency components in said RF signal above an input cutoff frequency to produce a filtered RF signal;

a first reference signal having a first operating frequency;

a first mixer having a first input coupled to an output of said input filter and a second input coupled to said first reference signal;

a second reference signal having a second operating frequency; and a second mixer having a first input coupled to an output of said first mixer and a second input coupled to said second reference signal, wherein said second mixer is an image rejection mixer, *wherein said first mixer and said second mixer are physically located in the same integrated circuit substrate.*

129. *The television receiver of claim 83 further comprising:*

*a digital interface to provide external control signals for controlling said television receiver.*

130. *The television receiver of claim 129 wherein said digital interface comprises:*

*an inter-integrated circuit bus.*

131. *The television receiver of claim 83 wherein said first reference signal, said first mixer, said first bandpass filter, said second reference signal, and said image rejection mixer provide a television tuner.*

132. *The television receiver of claim 83 wherein said first mixer, said first bandpass filter, and said image rejection mixer provide reception of 6 MHz channels allocated for television reception.*

133. *The television receiver of claim 84 wherein said subtractive mixer provides a mixer in which a frequency difference signal component created by a combination of two mixer signals of said first mixer is present in an output signal of said first mixer and a frequency sum signal component created by said combination of two mixer signals of said first mixer is filtered with respect to said output signal of said first mixer.*

134. *The television receiver of claim 83 wherein said first mixer comprises an element to filter a frequency sum signal component created by a combination of two mixer signals of said first mixer.*

135. *The television receiver of claim 83 wherein said first mixer and said image rejection mixer comprise a differential mixer chain.*

136. *The television receiver of claim 91 wherein said input filter provides a fixed input cutoff frequency.*

137. *The television receiver of claim 83 wherein said first operating frequency is variable and said second operating frequency is fixed.*

138. *The television receiver of claim 83 wherein said first mixer and said image rejection mixer are constructed on a same integrated circuit substrate.*

139. *The television receiver of claim 97 wherein said first mixer and said second mixer are constructed in said same substrate.*

140. *The television receiver of claim 97 further comprising:*

*a digital interface providing control with respect to said first mixer.*

141. *The television receiver of claim 140 wherein said digital interface comprises an inter-integrated circuit interface.*

142. *The television receiver of claim 97 wherein an output of said first mixer has a sum component of said first reference signal and a signal received from said receiver input filtered therefrom.*

143. *A television receiver comprising:*

*a receiver input coupled to an RF signal source;*

*a first mixer having a first input coupled to said receiver input and a second input coupled to a first reference signal having a first operating frequency, wherein said first operating frequency is variable between a minimum frequency value and a maximum frequency value;*

*a first bandpass filter constructed in the same integrated circuit substrate as said first mixer and coupled to an output of said first mixer; and*

*a second mixer having a first input coupled to an output of said first bandpass filter and a second input coupled to a second reference signal having a second operating frequency, wherein said second operating frequency is fixed, wherein said second mixer comprises an image rejection mixer.*

144. *The television receiver of claim 97 wherein said first reference signal has a variable frequency and said second reference signal has a fixed frequency.*

145. *The method of claim 102 wherein said mixing the RF signal, filtering the first IF signal, and mixing the output passband signal provide reception of 6 MHz channels allocated for television reception.*

146. *The method of claim 102 wherein said digital interface comprises an inter-integrated circuit bus.*

147. *The method of claim 103 wherein said filtering the RF signal utilizes a fixed input cutoff frequency filter.*

148. *The method of claim 105 wherein said subtractive mixing provides an output signal by said mixing the RF signal with a first reference signal and filtering a frequency sum signal component.*

149. *The method of claim 108 wherein said input cutoff frequency is fixed.*

150. *The method of claim 108 wherein said first reference signal is controlled by applying an external digital signal.*

151. *The method of claim 150 wherein said digital signal comprises an inter-integrated circuit bus signal.*

152. *The method of claim 108 wherein said subtractively mixing the amplified first filtered signal provides a signal in which a frequency difference signal component is present and a frequency sum signal component is filtered.*

153. *The method of claim 108 wherein said subtractively mixing the amplified first filtered signal and mixing the output passband signal are performed on a same integrated circuit substrate.*

154. *The method of claim 108 wherein a television tuner provides said subtractively mixing the amplified first filtered* signal, said filtering the first IF signal, and said mixing the output passband signal.

155. The television receiver of claim 120 wherein said input cutoff frequency is fixed.

156. The television receiver of claim 120 further comprising:

a digital interface, wherein said first operating frequency of said first reference signal is controlled by a signal applied to said digital interface.

157. The television receiver of claim 156 wherein said digital interface comprises an inter-integrated circuit bus.

158. The television receiver of claim 120 wherein said receiver input, said input filter, said first reference signal, said first mixer, said second reference signal, and said second mixer provide a television tuner.

159. The television receiver of claim 120 wherein said receiver input, said input filter, said first mixer, and said second mixer provide reception of 6 MHz channels allocated for television reception.

160. The television receiver of claim 123 wherein said subtractive mixing of said first mixer filters a frequency sum signal and provides a frequency difference signal as an output signal of said first mixer.

161. The television receiver of claim 120 further comprising:

a filter coupled to the output of said first mixer.

162. The television receiver of claim 161 further comprising:

a digital interface, wherein said first operating frequency of said first reference signal is controlled by a signal applied to said digital interface.

163. The television receiver of claim 162 wherein said first mixer and said second mixer comprise a differential mixer chain.

164. The television receiver of claim 120 wherein said first mixer includes a low-pass filter element.

* * * * *